(12) United States Patent
Arayashiki

(10) Patent No.: US 11,963,353 B2
(45) Date of Patent: Apr. 16, 2024

(54) SEMICONDUCTOR STORAGE DEVICE

(71) Applicant: Kioxia Corporation, Tokyo (JP)

(72) Inventor: Yusuke Arayashiki, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 431 days.

(21) Appl. No.: 17/460,944

(22) Filed: Aug. 30, 2021

(65) Prior Publication Data
US 2022/0310646 A1 Sep. 29, 2022

(30) Foreign Application Priority Data
Mar. 23, 2021 (JP) ................. 2021-049127

(51) Int. Cl.
H10B 43/27 (2023.01)
H01L 21/28 (2006.01)
H10B 41/10 (2023.01)
H10B 41/27 (2023.01)
H10B 41/50 (2023.01)
H10B 43/10 (2023.01)
H10B 43/50 (2023.01)

(52) U.S. Cl.
CPC ........ *H10B 43/27* (2023.02); *H01L 29/40114* (2019.08); *H01L 29/40117* (2019.08); *H10B 41/10* (2023.02); *H10B 41/27* (2023.02); *H10B 41/50* (2023.02); *H10B 43/10* (2023.02); *H10B 43/50* (2023.02)

(58) Field of Classification Search
CPC combination set(s) only.
See application file for complete search history.

(56) References Cited

U.S. PATENT DOCUMENTS

| 10,008,269 | B2 * | 6/2018 | Maejima | G11C 16/08 |
| 2017/0256316 | A1 * | 9/2017 | Maejima | G11C 16/26 |
| 2020/0212059 | A1 * | 7/2020 | Nishikawa | H10B 41/35 |
| 2022/0085060 | A1 * | 3/2022 | Narasaki | H10B 43/27 |
| 2022/0310640 | A1 * | 9/2022 | Fukuda | H10B 41/10 |
| 2022/0310646 | A1 * | 9/2022 | Arayashiki | H10B 41/27 |

FOREIGN PATENT DOCUMENTS

JP 2017-157260 A 9/2017

* cited by examiner

*Primary Examiner* — Earl N Taylor
(74) *Attorney, Agent, or Firm* — Foley & Lardner LLP

(57) ABSTRACT

A semiconductor storage device includes a third semiconductor layer and a fourth semiconductor layer. The third semiconductor layer has a first width; the third semiconductor layer and a first insulating layer are disposed apart with a first distance; the third semiconductor layer and a second insulating layer are disposed apart with a second distance; the fourth semiconductor layer has a second width; the fourth semiconductor layer and the first insulating layer are disposed apart with a third distance; and the fourth semiconductor layer and the second insulating layer are disposed apart with a fourth distance. A shorter one of the first distance and the second distance is shorter than a shorter one of the third distance and the fourth distance, and the first width is larger than the second width.

14 Claims, 32 Drawing Sheets

SEMICONDUCTOR STORAGE DEVICE

CROSS-REFERENCE TO RELATED APPLICATION

This application is based upon and claims the benefit of priority from Japanese Patent Application No. 2021-049127, filed Mar. 23, 2021, the entire contents of which are incorporated herein by reference.

FIELD

Embodiments described herein relate generally to a semiconductor storage device.

BACKGROUND

A semiconductor storage device includes a substrate, plural gate electrodes stacked in a direction intersecting a front surface of the substrate, semiconductor layers next to the plural gate electrodes, and gate insulating layers interposed between the gate electrodes and the semiconductor layers. The gate insulating layers each include data-storable memory portions such as an insulative charge storage portion of silicon nitride ($Si_3N_4$), for example, and a conductive charge storage portion such as a floating gate.

DETAILED DESCRIPTION

Figure 1:
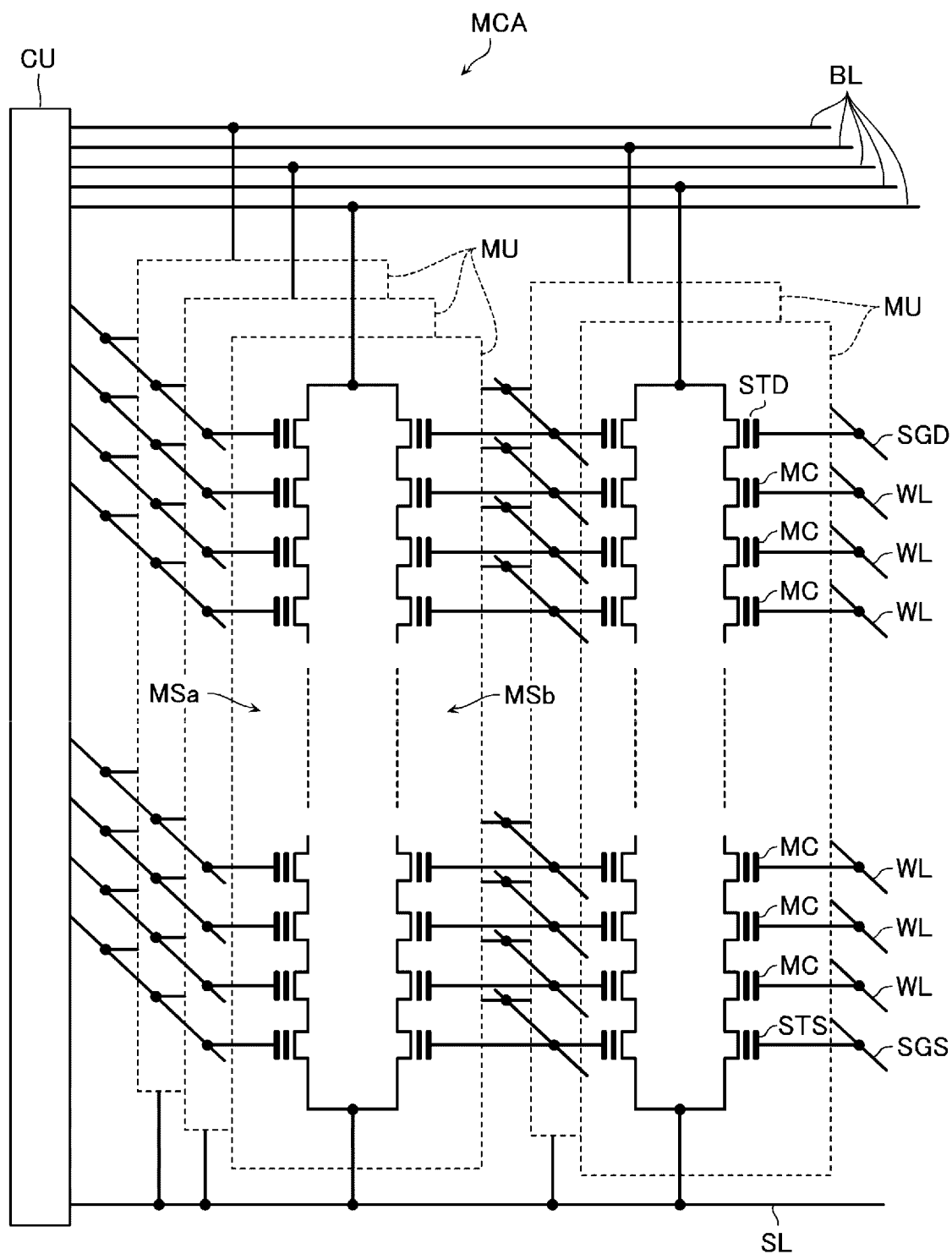
FIG. 1 is a schematic equivalent circuit diagram of a semiconductor storage device according to a first embodiment.

Embodiments provide a semiconductor storage device that enables higher integration.

In general, according to one embodiment, a semiconductor storage device includes: a first conductive layer extending in a first direction; a second conductive layer extending in the first direction and disposed apart from the first conductive layer in a second direction intersecting the first direction; a third conductive layer extending in the first direction and disposed apart from the first conductive layer and the second conductive layer in the second direction; a plurality of first semiconductor layers interposed between the first conductive layer and the second conductive layer, each of the plurality of first semiconductor layers including regions adjacent the first conductive layer and the second conductive layer, respectively; a plurality of first memory cells interposed between the first conductive layer and the plurality of first semiconductor layers; a plurality of second memory cells interposed between the second conductive layer and the plurality of first semiconductor layers; a plurality of second semiconductor layers interposed between the second conductive layer and the third conductive layer, each of the plurality of second semiconductor layers including regions adjacent the second conductive layer and the third conductive layer, respectively; a plurality of third memory cells interposed between the second conductive layer and the plurality of second semiconductor layers; a plurality of fourth memory cells interposed between the third conductive layer and the plurality of second semiconductor layers; a first insulating layer interposed between the first conductive layer and the second conductive layer, the first insulating layer being wider than the plurality of first semiconductor layers and the plurality of second semiconductor layers in the second direction; and a second insulating layer interposed between the second conductive layer and the third conductive layer, the second insulating layer being wider than the first semiconductor layers and the second semiconductor layers in the second direction. A third semiconductor layer and a fourth semiconductor layer from among the plurality of first semiconductor layers are provided as follows: the third semiconductor layer has a first width in the first direction; the third semiconductor layer and the first insulating layer are disposed apart from each other in the first direction with a first distance; the third semiconductor layer and the second insulating layer are disposed apart from each other in the first direction with a second distance; the fourth semiconductor layer has a second width in the first direction; the fourth semiconductor layer and the first insulating layer are disposed apart from each other in the first direction with a third distance; and the fourth semiconductor layer and the second insulating layer are disposed apart from each other in the first direction with a fourth distance. A shorter one of the first distance and the second distance is shorter than a shorter one of the third distance and the fourth distance, and the first width is larger than the second width.

Hereinafter, a semiconductor storage device according to an embodiment will be described in detail with reference to the accompanying drawings. The following embodiment is provided for exemplifying purposes only and is not intended to limit the disclosure. The drawings below are schematic diagrams from which some components, for example, may be omitted for convenience of description. In some cases, common components in plural embodiments are denoted with identical reference signs and will not be repeatedly elaborated.

In this specification, a "semiconductor storage device" may mean a memory die or may mean a memory system including a control die, such as a memory chip, a memory card, and a solid state drive (SSD). Moreover, the "semiconductor storage device" may mean a structure including a host computer, examples of which include a smartphone, a tablet device, and a personal computer.

In this specification, when a first component is "electrically connected" to a second component, the first component may be connected to the second component directly or with a component such as wiring, a semiconductor member or a transistor. For example, when three transistors are connected in series, a first transistor is "electrically connected" to a third transistor even when a second transistor is off.

In this specification, when a first component is "interposed between" a second component and a third component, the first component, the second component, and the third component may be connected in series, and at the same time, the second component may be connected to the third component with the first component.

In this specification, a predetermined direction parallel to an upper surface of a substrate is referred to as an "X direction", a direction parallel to the upper surface of the substrate and orthogonal to the X direction is referred to as a "Y direction", and a direction orthogonal to the upper surface of the substrate is referred to as a "Z direction".

In this specification, a direction along a predetermined plane may be referred to as a "first direction", a direction along the predetermined plane and intersecting the first direction may be referred to as a "second direction", and a direction intersecting the predetermined plane may be referred to as a "third direction". Each of the first direction, the second direction, and the third direction may or may not correspond to one of the X direction, the Y direction, and the Z direction.

In this specification, terms such as "upper" and "lower" are used with the substrate as a reference. For example, a direction away from the substrate along the Z direction is referred to as "upper", and a direction toward the substrate along the Z direction is referred to as "lower". A lower surface and a lower end of a component means a surface and an end of this component on the substrate side, and an upper surface and an upper end of the component means a surface and an end of the component on a side opposite the substrate side. A surface of the component intersecting the X direction or the Y direction is referred to as a "side surface", for example.

First Embodiment

Configuration

FIG. 1 is a schematic equivalent circuit diagram of a semiconductor storage device according to a first embodiment.

The semiconductor storage device according to this embodiment includes a memory cell array MCA and a controller CU to control the memory cell array MCA.

The memory cell array MCA includes plural memory units MU. Each of the plural memory units MU includes two memory strings MSa and MSb electrically independent. One end of each of the memory strings MSa and MSb is connected to a drain-side select transistor STD and connected to a common bit line BL with the drain-side select transistor STD. The other end of each of the memory strings MSa and MSb is connected to a source-side select transistor STS and connected to a common source line SL with the source-side select transistor STS.

Each of the memory strings MSa and MSb includes plural memory cells MC connected in series. Each of the memory cells MC is a field-effect transistor including a semiconductor layer, a gate insulating layer, and a gate electrode. The semiconductor layer functions as a channel region. The gate insulating layer includes a charge storage portion where data is storable. A threshold voltage of the memory cell MC changes in accordance with a charge amount in the charge storage portion. The gate electrode is part of a word line WL.

Each of the select transistors STD and STS is a field-effect transistor including a semiconductor layer, a gate insulating layer, and a gate electrode. The semiconductor layer functions as a channel region. The gate electrode of the drain-side select transistor STD is part of a drain-side select gate line SGD. The gate electrode of the source-side select transistor STS is part of a source-side select gate line SGS.

The controller CU generates a voltage required for read, write, and erase operations, for example, and supplies the voltage to the bit line BL, the source line SL, the word lines WL, and the select gate lines SGD and SGS. The controller CU may include, for example, plural transistors and wiring disposed on the same substrate as the memory cell array MCA or may include plural transistors and wiring disposed on a substrate different from the substrate of the memory cell array MCA.

Figure 2:
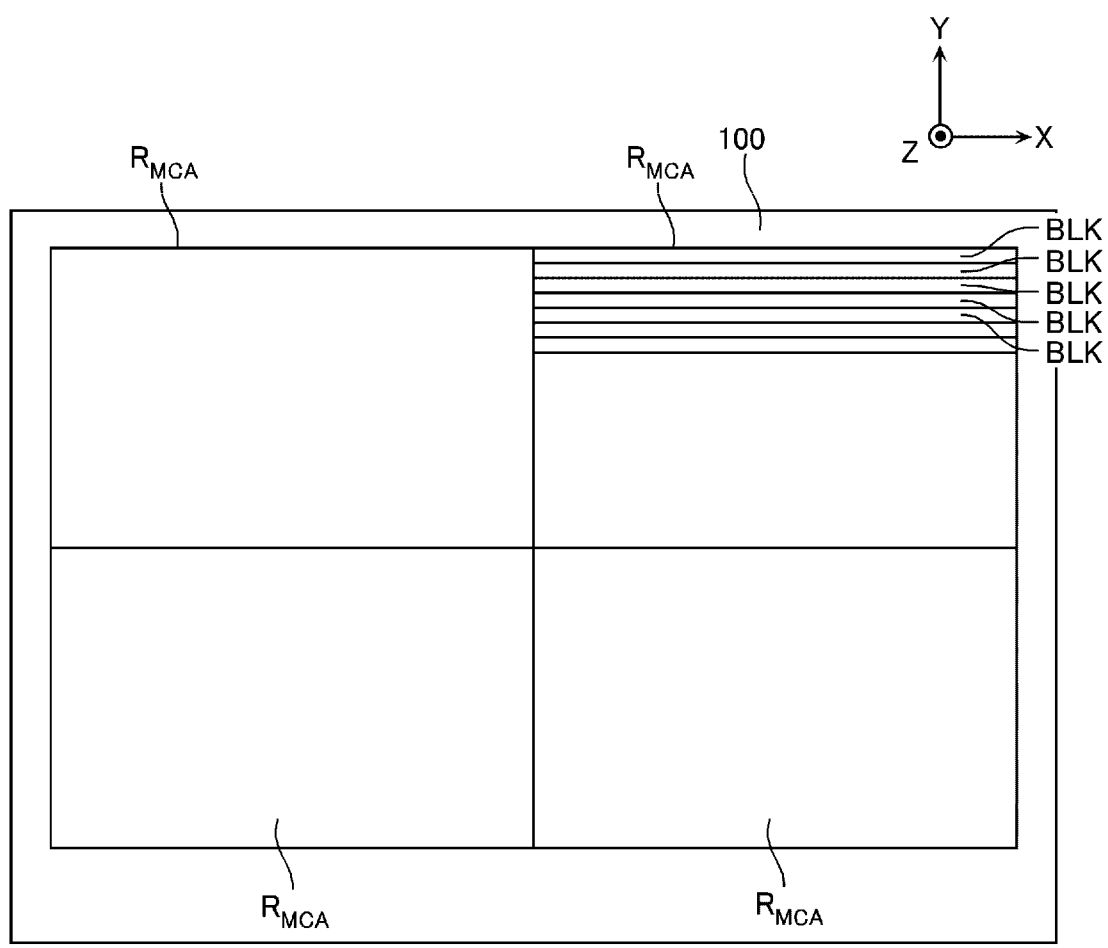
FIG. 2 is a schematic plan view of the semiconductor storage device.

FIG. 2 is a schematic plan view of the semiconductor storage device according to this embodiment, illustrating a configuration example thereof.

The semiconductor storage device according to this embodiment includes a semiconductor substrate 100. In the illustrated example, on the semiconductor substrate 100, four memory cell array regions $R_{MCA}$ are disposed in the X direction and the Y direction. Each of the memory cell array regions $R_{MCA}$ includes plural memory blocks BLK disposed in the Y direction. Each of the memory blocks BLK extends in the X direction.

The semiconductor substrate 100 is, for example, a semiconductor substrate of a material such as monocrystal silicon (Si). The semiconductor substrate 100 has, for example, a dual-well configuration including an n-type impurity layer on an upper surface of the semiconductor substrate and a p-type impurity layer inside the n-type impurity layer. It is noted that components such as transistors and wiring that constitute at least part of the controller CU (see FIG. 1), for example, may be disposed on a surface of the semiconductor substrate 100.

Figure 3:
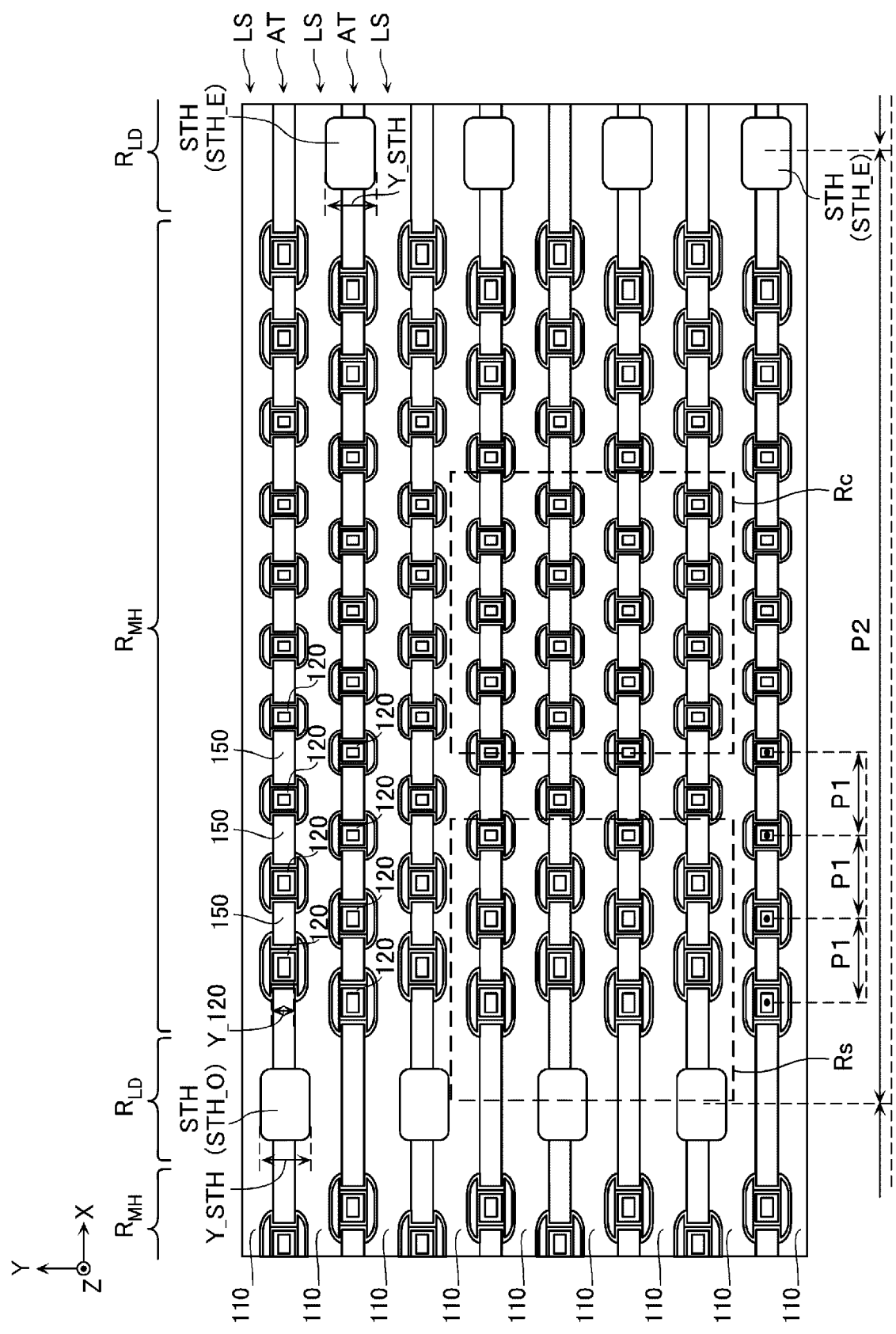
FIG. 3 is a schematic cross-sectional view of the semiconductor storage device.
Figure 4:
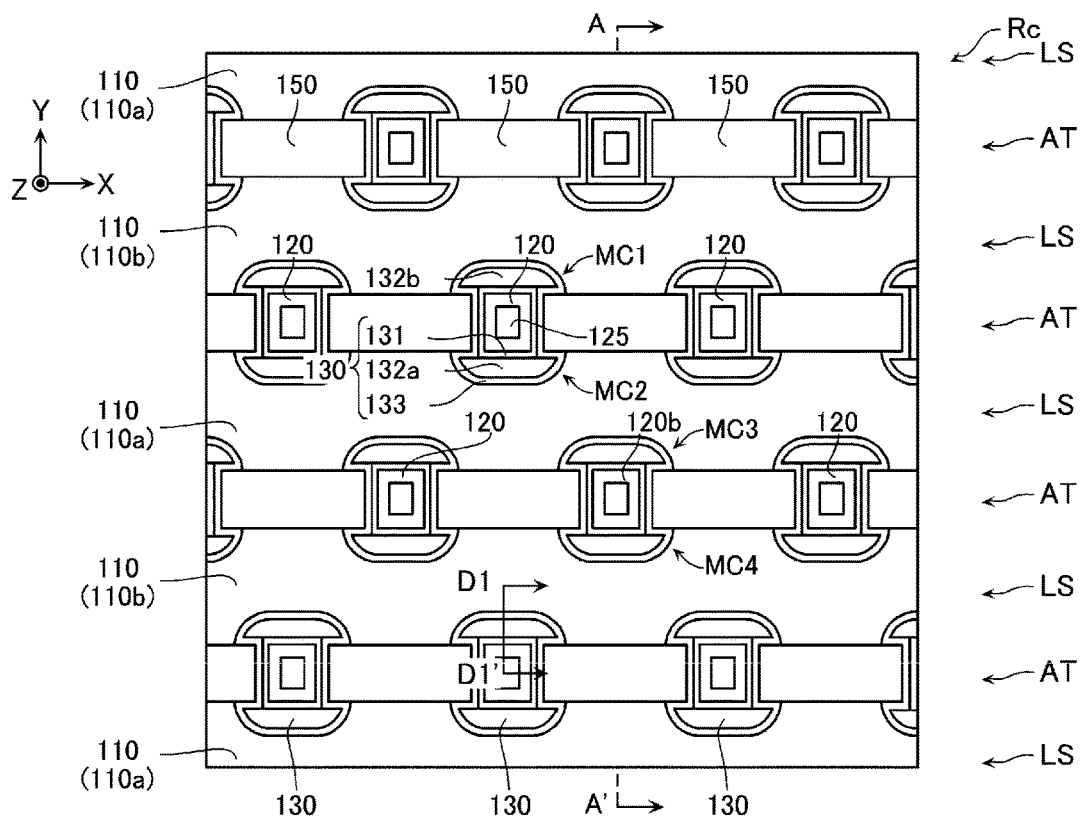
FIG. 4 is a schematic cross-sectional view of the semiconductor storage device.
Figure 5:
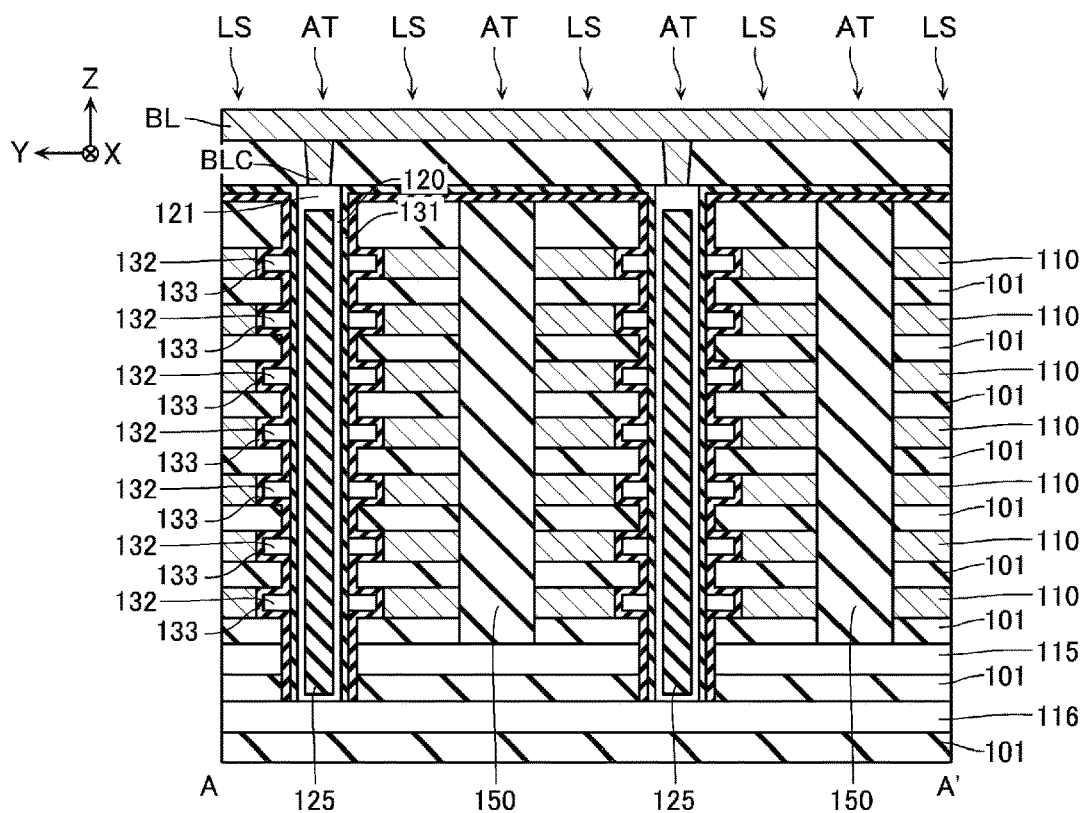
FIG. 5 is a schematic cross-sectional view of the semiconductor storage device.
Figure 6:
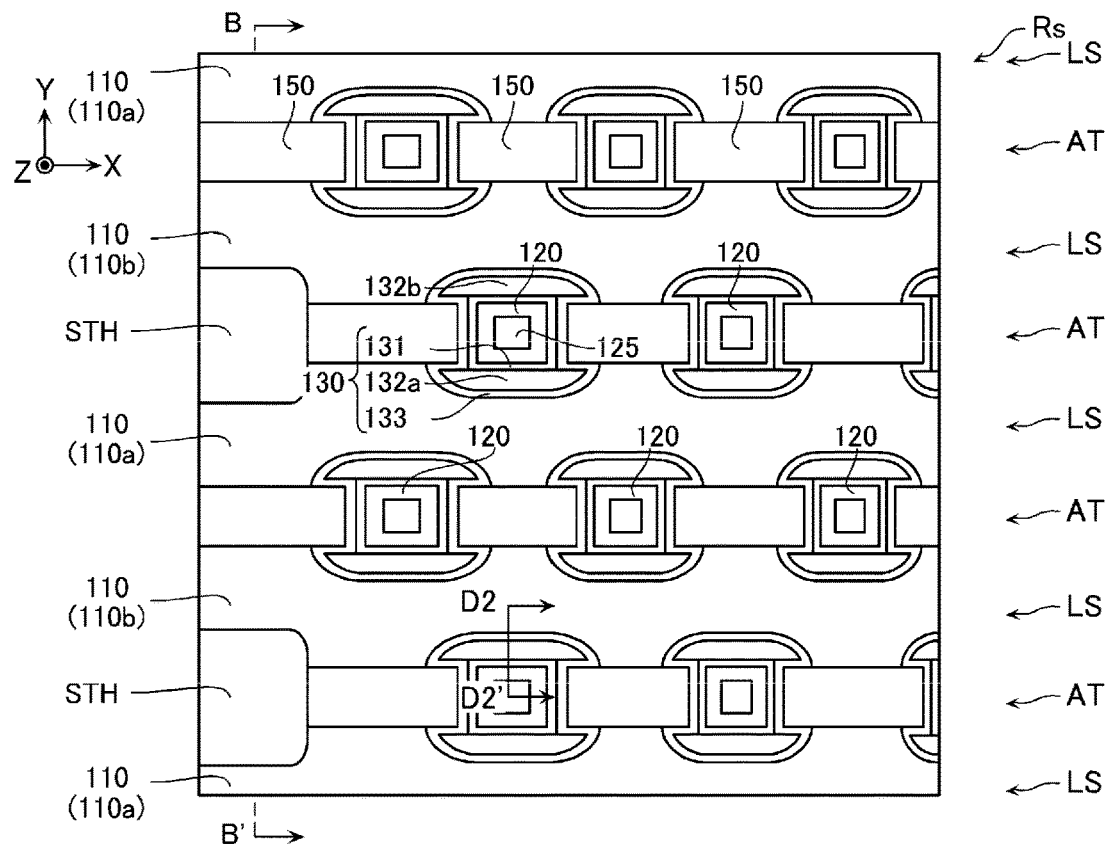
FIG. 6 is a schematic cross-sectional view of the semiconductor storage device.
Figure 7:
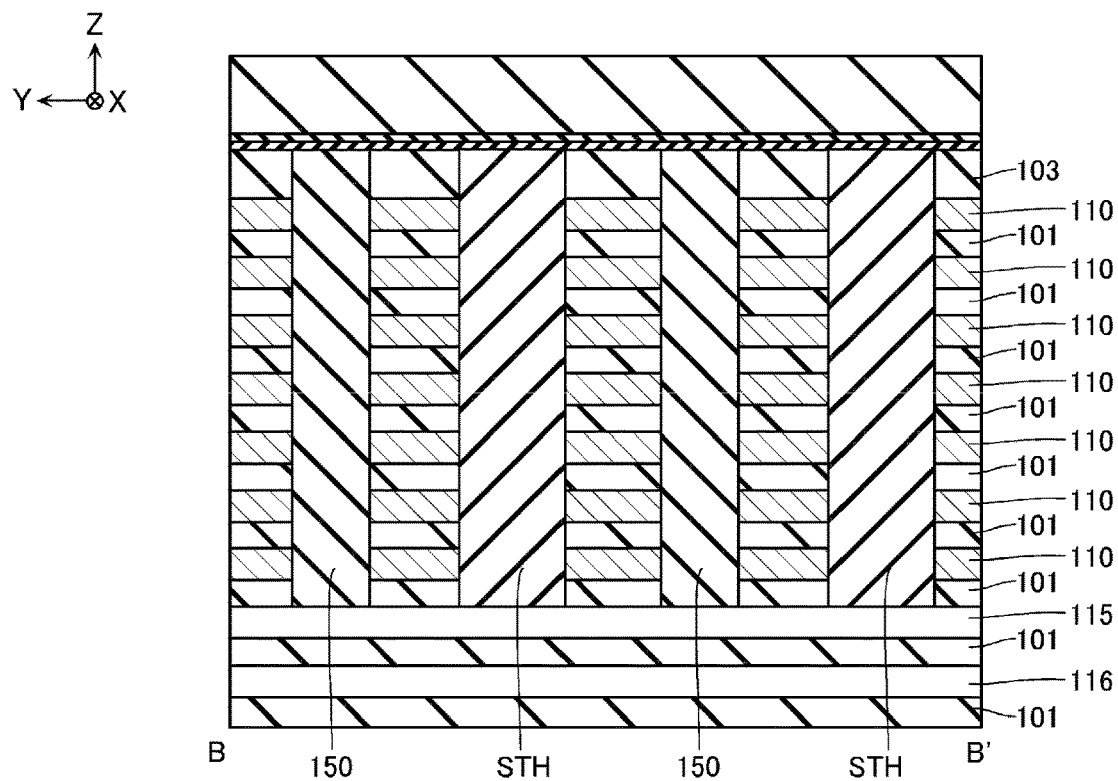
FIG. 7 is a schematic cross-sectional view of the semiconductor storage device.
Figure 8:
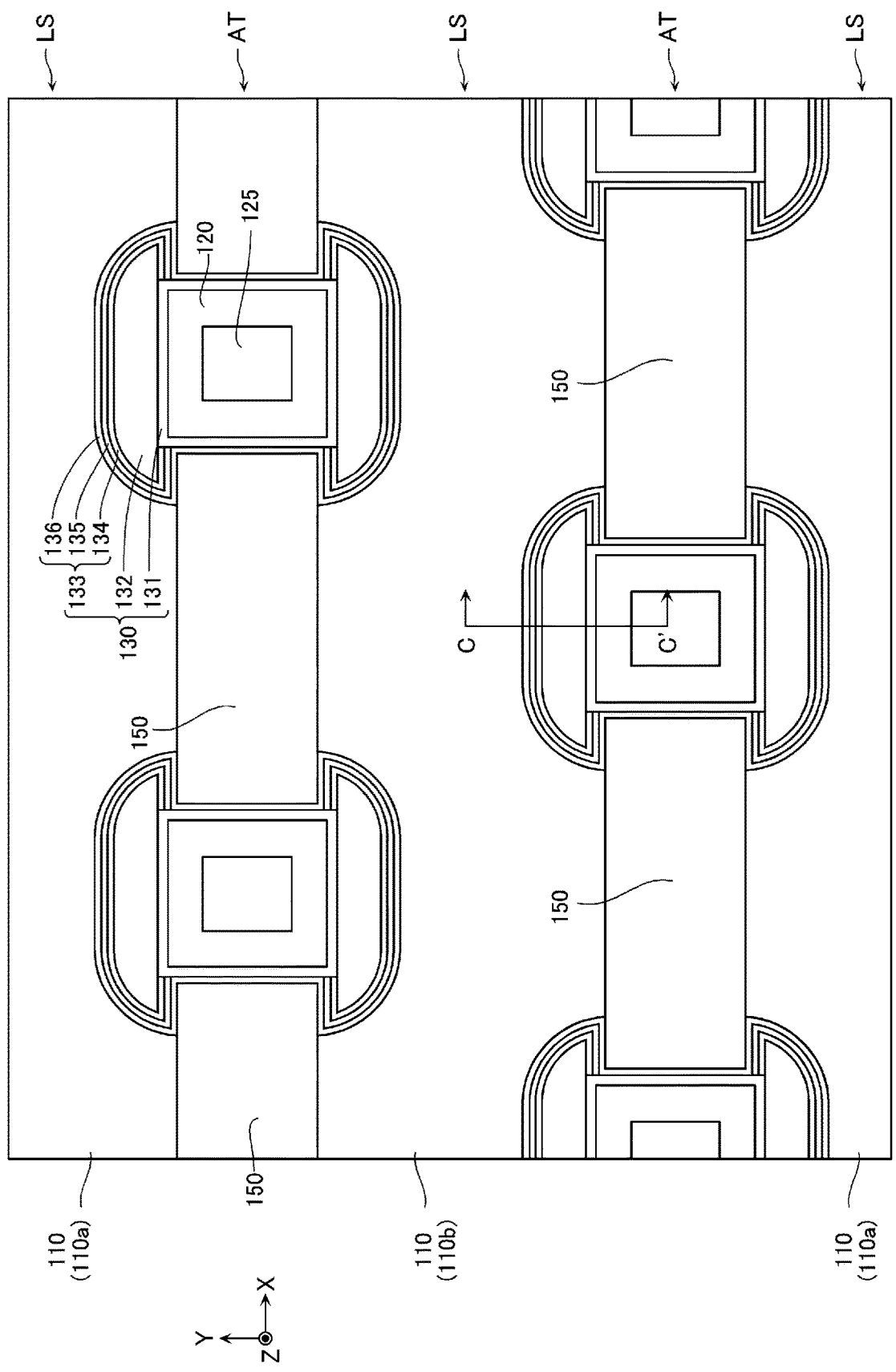
FIG. 8 is a schematic cross-sectional view of the semiconductor storage device.
Figure 9:
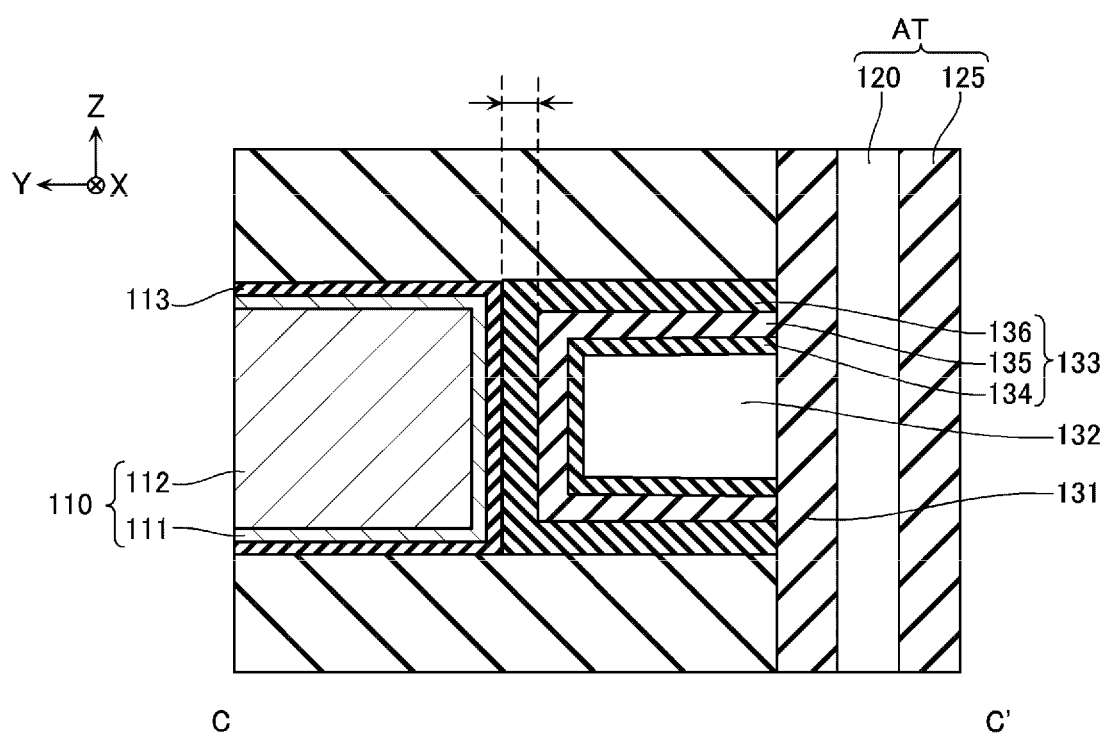
FIG. 9 is a schematic cross-sectional view of the semiconductor storage device.

FIG. 3 is a schematic X-Y cross-sectional view of the memory cell array region $R_{MCA}$, illustrating a partial configuration thereof. FIG. 4 is a schematic X-Y cross-sectional view of a region Rc indicated in FIG. 3, illustrating a configuration thereof. FIG. 5 is a schematic Y-Z cross-sectional view of the configuration illustrated in FIG. 4, taken along line A-A', as viewed in a direction indicated with arrows. FIG. 6 is a schematic X-Y cross-sectional view of a region Rs indicated in FIG. 3, illustrating a configuration thereof. FIG. 7 is a schematic Y-Z cross-sectional view of the configuration illustrated in FIG. 6, taken along line B-B', as viewed in a direction indicated with arrows. FIG. 8 is a schematic enlarged view of part of the configuration illustrated in FIG. 3. FIG. 9 is a schematic Y-Z cross-sectional view of the configuration illustrated in FIG. 8, taken along line C-C', as viewed in a direction indicated with arrows.

As illustrated in FIGS. 3, 4, and 6, for example, the semiconductor storage device according to this embodiment includes plural stacked body structures LS and plural trench structures AT. The plural stacked body structures LS are disposed in the Y direction on the semiconductor substrate 100. Each of the plural trench structures AT is interposed between each adjacent pair of the plural stacked body structures LS.

Each of the stacked body structures LS (see FIGS. 5 and 7) includes plural conductive layers 110, a semiconductor layer 115, and a semiconductor layer 116. The plural conductive layers 110, the semiconductor layer 115, and the semiconductor layer 116 are stacked in the Z direction with an insulating layer 101 of silicon oxide ($SiO_2$), for example, interposed between each adjacent pair of the conductive layers 110, the semiconductor layer 115, and the semiconductor layer 116.

Each of the trench structures AT (see FIG. 3) includes plural memory hole regions $R_{MH}$ disposed in the X direction, and a ladder region $R_{LD}$ interposed between each adjacent pair of the memory hole regions $R_{MH}$ in the X direction.

Each of the memory hole regions $R_{MH}$ includes plural semiconductor layers 120 in the X direction. As illustrated in FIG. 3, for example, the plural semiconductor layers 120 are disposed with a pitch P1 in the X direction. A gate insulating layer 130 is interposed between each of the plural semiconductor layers 120 and each of the plural conductive layers 110. An insulating layer 150 of silicon oxide ($SiO_2$), for example, is interposed between each adjacent pair of the semiconductor layers 120 in the X direction.

The ladder regions $R_{LD}$ may or may not include insulating layers STH of silicon oxide ($SiO_2$), for example. As illustrated in FIG. 3, for example, the insulating layers STH are disposed with a pitch P2 in the X direction. The pitch P2 is larger than the pitch P1. A width Y_STH of the insulating layers STH in the Y direction is larger than a width Y_120 of the semiconductor layers 120 in the Y direction.

It is noted that as illustrated in FIG. 3, for example, the plural insulating layers STH may be disposed in a staggered arrangement in an X-Y cross section. In this case, for example, the insulating layer STH disposed in an odd-numbered trench structure AT from one side of the Y direction will be occasionally referred to as insulating layer STH_O. The insulating layer STH disposed in an even-numbered trench structure AT from the one side of the Y direction will be occasionally referred to as insulating layer STH_E. The plural insulating layers STH_O are disposed in odd-numbered ladder regions $R_{LD}$ from one side of the X direction and may not be disposed in even-numbered ladder regions $R_{LD}$. The plural insulating layers STH_O may be disposed in the Y direction. The plural insulating layers STH_E are disposed in the even-numbered ladder regions $R_{LD}$ from the one side of the X direction and may not be disposed in the odd-numbered ladder regions $R_{LD}$. The plural insulating layers STH_E may be disposed in the Y direction.

As illustrated in FIGS. 5 and 7, for example, the plural conductive layers 110 are disposed in the Z direction. The conductive layers 110 extend in the X direction. As illustrated in FIG. 9, for example, each of the conductive layers 110 is a stacked film including a barrier conductive layer 111 of a material such as titanium nitride (TiN) and a metal film 112 of a material such as tungsten (W). Some of the conductive layers 110 individually function as the word lines WL and the gate electrodes of the memory cells MC (see FIG. 1). Some of the conductive layers 110 disposed above these conductive layers 110 function as the drain-side select gate line SGD and the gate electrodes of the drain-side select transistor STD (see FIG. 1). It is noted that as illustrated in FIG. 9, an insulative metal oxide layer 113 of alumina (AlO), for example, may be disposed on and partly cover an upper surface, a lower surface, and side surfaces of each of the conductive layers 110.

The semiconductor layer 115 (see FIGS. 5 and 7) is disposed below the plural conductive layers 110. The semiconductor layer 115 extends in the X direction. The semiconductor layer 115 includes polycrystal silicon (Si), for example. The semiconductor layer 115 functions as the source-side select gate line SGS and the gate electrode of the source-side select transistor STS (see FIG. 1).

The semiconductor layer 116 is disposed below the semiconductor layer 115. The semiconductor layer 116 extends in the X direction. The semiconductor layer 116 includes polycrystal silicon (Si), for example. The semiconductor layer 116 functions as part of the source line SL (see FIG. 1).

In the following description, when two of the stacked body structures LS adjacent in the Y direction are focused on, the plural conductive layers 110 of one of the stacked body structures LS will be occasionally referred to as conductive layers 110a (see FIGS. 4 and 6). The plural conductive layers 110 of the other of the stacked body structures LS will be occasionally referred to as conductive layers 110b (see FIGS. 4 and 6). The conductive layers 110a and the conductive layers 110b are electrically independent from each other. Consequently, different voltages can be supplied to the conductive layers 110a and the conductive layers 110b. The conductive layers 110a function as the gate electrodes of the memory cells MC of the memory string MSa or the gate electrode of the drain-side select transistor STD of the memory string MSa. The conductive layers 110b function as the gate electrodes of the memory cells MC of the memory string MSb or the gate electrode of the drain-side select transistor STD of the memory string MSb.

The semiconductor layers 120 extend in the Z direction (see FIGS. 5 and 7). The semiconductor layers 120 are made of undoped polycrystal silicon (Si), for example. The semiconductor layers 120 each have a substantially bottomed, hollow quadrangular prism shape, and an insulating layer 125 of silicon oxide (SiO$_2$), for example, is disposed in a center portion of the semiconductor layer 120. Regions of the semiconductor layer 120 that are next to the plural conductive layers 110a function as channel regions of the plural memory cells MC of the memory string MSa (see FIG. 1) and channel regions of the drain-side select transistor STD and the source-side select transistor STS. Regions of the semiconductor layer 120 that are next to the plural conductive layers 110b function as channel regions of the plural memory cells MC of the memory string MSb (see FIG. 1) and channel regions of the drain-side select transistor STD and the source-side select transistor STS.

A semiconductor layer 121 (see FIG. 5) containing an N-type impurity such as phosphorus (P) is disposed on an upper end of the semiconductor layer 120. The semiconductor layer 121 is connected to the bit line BL extending in the Y direction with a bit line contact BLC of tungsten (W), for example.

In the illustrated example, a lower end of the semiconductor layer 120 is connected to the semiconductor layer 116.

The gate insulating layer 130 (see FIGS. 8 and 9) includes a tunnel insulating layer 131, a charge storage layer 132, and a block insulating layer 133 that are disposed from the semiconductor layer 120 side to the conductive layer 110 side.

The tunnel insulating layer 131 includes, for example, an insulating layer of silicon oxide (SiO$_2$), silicon oxynitride (SiON) or other materials. As illustrated in FIG. 5, for example, the tunnel insulating layer 131 may extend in the Z direction along outer peripheral surfaces of the semiconductor layer 120. It is noted that the tunnel insulating layer 131 may be formed on each side surface of the charge storage layer 132 in the Y direction.

The charge storage layer 132 is, for example, a floating gate of polycrystal silicon containing an N-type impurity such as phosphorus (P) or a P-type impurity such as boron (B). It is noted that the charge storage layer 132 may be an insulative charge storage portion containing silicon nitride (SiN), for example.

In the following description, as illustrated in FIGS. 4 and 6, for example, the plural charge storage layers 132 interposed between the conductive layers 110a and the plural semiconductor layers 120 will be occasionally referred to as charge storage layers 132a. The plural charge storage layers 132 interposed between the conductive layers 110b and the plural semiconductor layers 120 will be occasionally referred to as charge storage layers 132b.

As illustrated in FIGS. 8 and 9, for example, the block insulating layer 133 includes an insulating layer 134, a high dielectric layer 135, and an insulating layer 136.

The insulating layer 134 is, for example, a stacked film of a material such as silicon oxide (SiO$_2$) or of titanium nitride (TiN) and silicon oxide (SiO$_2$). As illustrated in FIG. 8, the insulating layer 134 partly covers outer peripheral surfaces of the charge storage layer 132 in an X-Y cross section. As illustrated in FIG. 9, the insulating layer 134 covers an upper surface, a lower surface, and a side surface of the charge storage layer 132 on the conductive layer 110 side in a Y-Z cross section.

The high dielectric layer 135 includes, for example, an insulative material of a relatively high relative dielectric constant such as hafnium silicate (HfSiO). As illustrated in FIG. 8, the high dielectric layer 135 partly covers the outer peripheral surface of the charge storage layer 132 via the insulating layer 134 in an X-Y cross section. As illustrated in FIG. 9, the high dielectric layer 135 covers an upper surface, a lower surface, and a side surface of the insulating layer 134 on the conductive layer 110 side in a Y-Z cross section.

The insulating layer 136 includes, for example, an insulating layer of a material such as silicon oxide (SiO$_2$). As illustrated in FIG. 8, the insulating layer 136 partly covers the outer peripheral surface of the charge storage layer 132 via the high dielectric layer 135 in an X-Y cross section. As illustrated in FIG. 9, the insulating layer 136 covers an upper surface, a lower surface, and a side surface of the high dielectric layer 135 on the conductive layer 110 side in a Y-Z cross section.

The insulating layers STH (see FIGS. 6 and 7) each extend in the Z direction and are next to the plural conductive layers 110 in the X direction and the Y direction. The insulating layer STH includes, for example, an insulating layer of silicon oxide (SiO$_2$).

Widths of Semiconductor Layers 120

Next, widths of the plural semiconductor layers 120 in the X direction will be described with reference to FIG. 10. FIG.

10 is a schematic X-Y cross-sectional view of the memory cell array $R_{MCA}$, illustrating a partial configuration thereof.

Figure 10:
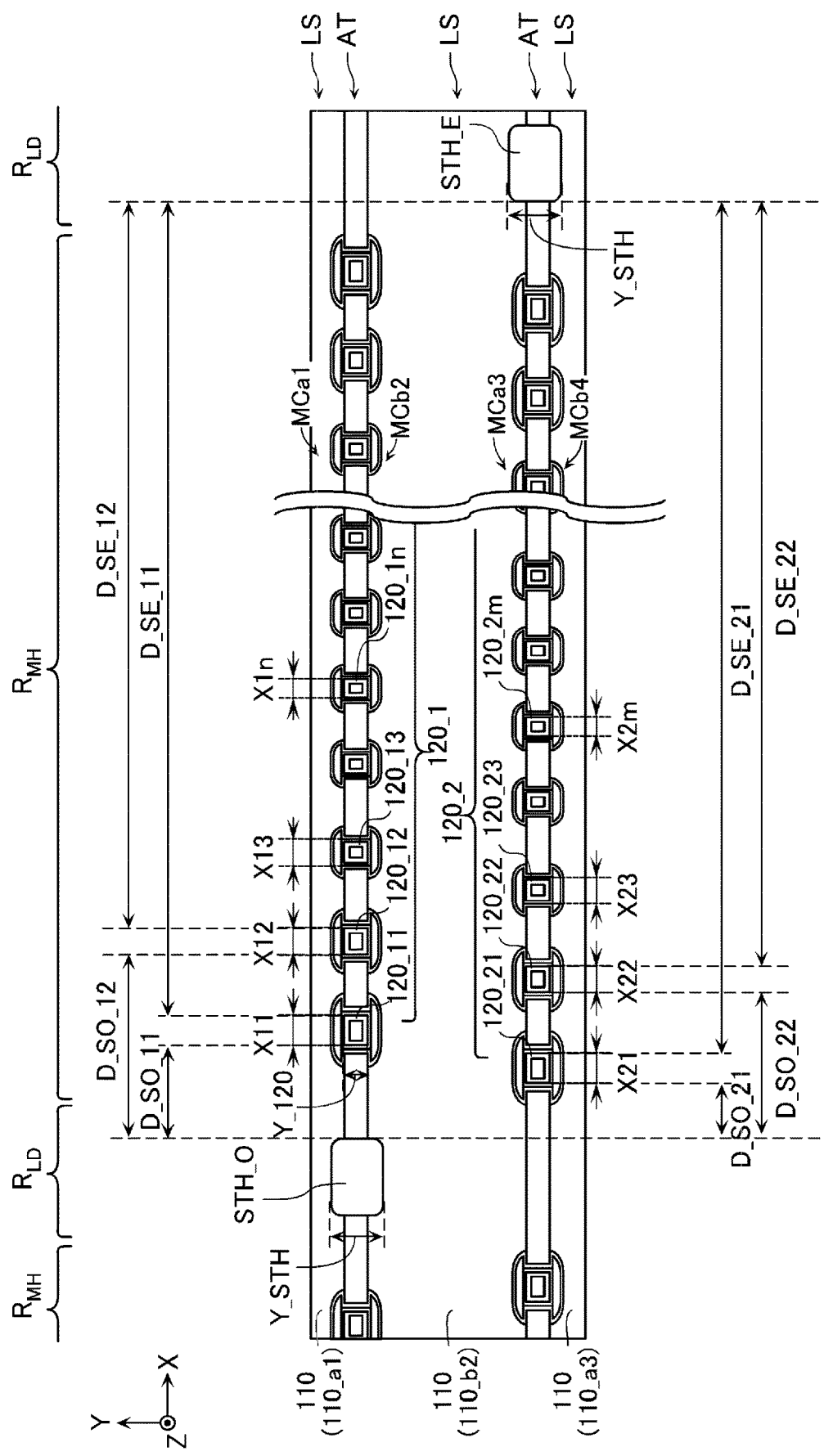
FIG. 10 is a schematic cross-sectional view of the semiconductor storage device.

As illustrated in FIG. 10, in the semiconductor storage device according to the embodiment, those of the plural semiconductor layers 120 that are closer to a center position of the memory hole region $R_{MH}$ in the X direction have smaller width in the X direction, and those of the plural semiconductor layers 120 that are farther from the center position of the memory hole region $R_{MH}$ in the X direction have larger widths in the X direction.

This aspect will be described in more detail below. In the following description, one of the conductive layers 110 extending in the X direction will be referred to as conductive layer 110_a1. Another of the conductive layers 110 that is separate from the conductive layer 110_a1 in the Y direction and extends in the X direction will be referred to as conductive layer 110_b2. Another of the conductive layers 110 that is separate from the conductive layer 110_a1 and the conductive layer 110_b2 in the Y direction and extends in the X direction will be referred to as conductive layer 110_a3. The plural semiconductor layers 120 interposed between the conductive layer 110_a1 and the conductive layer 110_b2, disposed in the X direction, and next to the conductive layer 110_a1 and the conductive layer 110_b2 will be referred to as plural semiconductor layers 120_1. The plural semiconductor layers 120 interposed between the conductive layer 110_b2 and the conductive layer 110_a3, disposed in the X direction, and next to the conductive layer 110_b2 and the conductive layer 110_a3 will be referred to as plural semiconductor layers 120_2.

In the following description, of the plural semiconductor layers 120_1 in the memory hole region $R_{MH}$, the semiconductor layer 120_1 closest to one end of the memory hole region $R_{MH}$ in the X direction and the semiconductor layer 120_1 closest to the other end of the memory hole region $R_{MH}$ in the X direction will be each referred to as semiconductor layer 120_11. The semiconductor layer 120_1 second closest to the one end of the memory hole region $R_{MH}$ in the X direction and the semiconductor layer 120_1 second closest to the other end of the memory hole region $R_{MH}$ in the X direction will be each referred to as semiconductor layer 120_12. Similarly, the semiconductor layer 120_1 nth (n represents an integer of 1 or larger) closest to the one end of the memory hole region $R_{MH}$ in the X direction and the semiconductor layer 120_1 nth closest to the other end of the memory hole region $R_{MH}$ in the X direction will be each referred to as semiconductor layer 120_1n. A width of the semiconductor layer 120_1n will be referred to as width X1n. The width X1n is larger than a width X1(n+1).

Suppose, for example, that n is 1, and that n is 2. The semiconductor layer 120_11 and the semiconductor layer 120_12 respectively have a width X11 and a width X12 in the X direction. The width X11 is larger than the width X12.

A distance between the semiconductor layer 120_11 and the insulating layer STH_O in the X direction will be referred to as distance D_SO_11, and a distance between the semiconductor layer 120_11 and the insulating layer STH_E in the X direction will be referred to as distance D_SE_11. A distance between the semiconductor layer 120_12 and the insulating layer STH_O in the X direction will be referred to as distance D_SO_12, and a distance between the semiconductor layer 120_12 and the insulating layer STH_E in the X direction will be referred to as distance D_SE_12. In this case, the smaller one of the distance D_SO_11 and the distance D_SE_11 is smaller than the smaller one of the distance D_SO_12 and the distance D_SE_12.

In the following description, of the plural semiconductor layers 120_2 in the memory hole region $R_{MH}$, the semiconductor layer 120_2 mth (m is an integer of 1 or larger) closest to the one end of the memory hole region $R_{MH}$ in the X direction and the semiconductor layer 120_2 mth closest to the other end of the memory hole region $R_{MH}$ in the X direction will be each referred to as semiconductor layer 120_2m. A width of the semiconductor layer 120_2m will be referred to as width X2m. The width X2m is larger than a width X2(m+1).

Suppose, for example, that m is 1, and that m is 2. The semiconductor layer 120_21 and the semiconductor layer 120_22 respectively have a width X21 and a width X22 in the X direction. The width X21 is larger than the width X22.

A distance between the semiconductor layer 120_21 and the insulating layer STH_O in the X direction will be referred to as distance D_SO_21, and a distance between the semiconductor layer 120_21 and the insulating layer STH_E in the X direction will be referred to as distance D_SE_21. A distance between the semiconductor layer 120_22 and the insulating layer STH_O in the X direction will be referred to as distance D_SO_22, and a distance between the semiconductor layer 120_22 and the insulating layer STH_E in the X direction will be referred to as distance D_SE_22. In this case, the smaller one of the distance D_SO_21 and the distance D_SE_21 is smaller than the smaller one of the distance D_SO_22 and the distance D_SE_22.

It is noted that in the above-described configuration, the plural semiconductor layers 120_1 may be individually next to the plural conductive layers 110_a1 and the plural conductive layers 110_b2 that are disposed in the Z direction. The plural semiconductor layers 120_2 may be individually next to the plural conductive layers 110_b2 and the plural conductive layers 110_a3 that are disposed in the Z direction.

Widths of Charge Storage Layers 132

As illustrated in FIG. 10, in the semiconductor storage device according to the embodiment, the plural charge storage layers 132 that are closer to the center position of the memory hole region $R_{MH}$ in the X direction have smaller widths in the X direction, and the plural charge storage layers 132 that are farther from the center position of the memory hole region $R_{MH}$ in the X direction have larger widths in the X direction.

Manufacturing Method

Next, referring to FIGS. 11 to 50, a manufacturing method of the semiconductor storage device according to the embodiment will be described.

FIGS. 11, 13, 17, 19, 21, 23, 25, 27, 29, 31, 33, 35, 37, 45, and 49 are schematic X-Y cross-sectional views illustrating the manufacturing method and correspond to FIG. 4. FIGS. 15, 39, 41, 43, and 47 are schematic X-Y cross-sectional views illustrating the manufacturing method and correspond to FIG. 6.

FIGS. 12, 14, 18, 20, 22, 24, 26, 28, 30, 32, 34, 36, 38, 46, and 50 are schematic Y-Z cross-sectional views illustrating the manufacturing method and correspond to FIG. 5. FIGS. 16, 40, 42, 44, and 48 are schematic Y-Z cross-sectional views illustrating the manufacturing method and correspond to FIG. 7.

Figure 11:
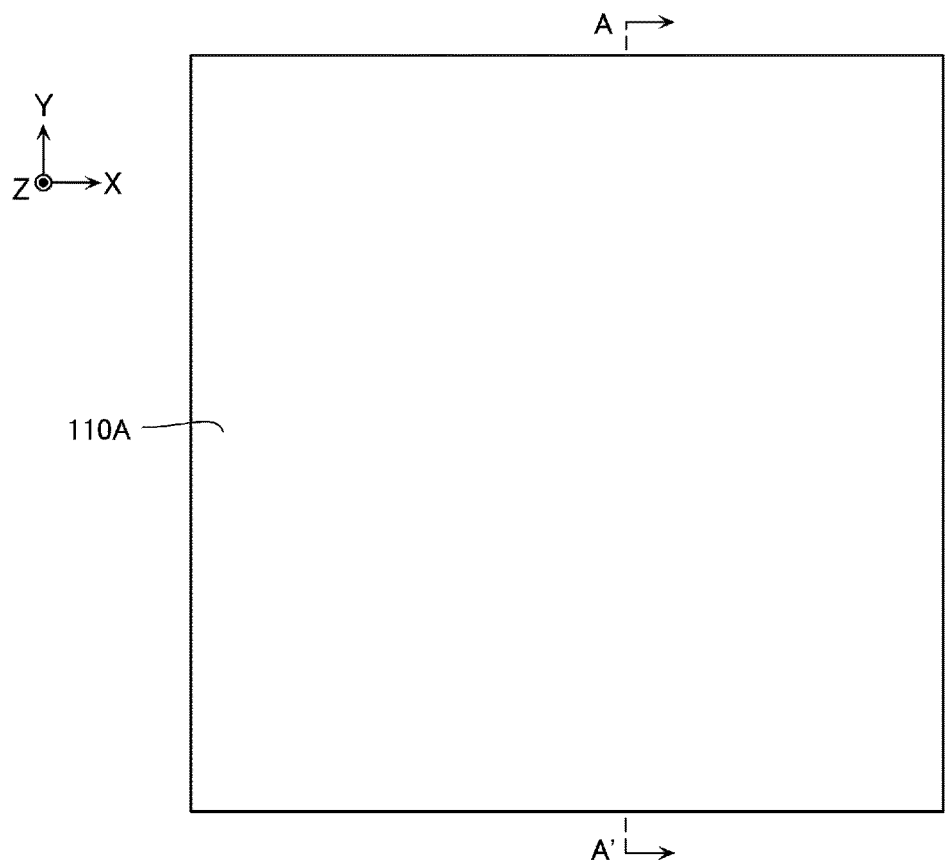
FIG. 11 is a schematic cross-sectional view illustrating a manufacturing method of the semiconductor storage device.
Figure 12:
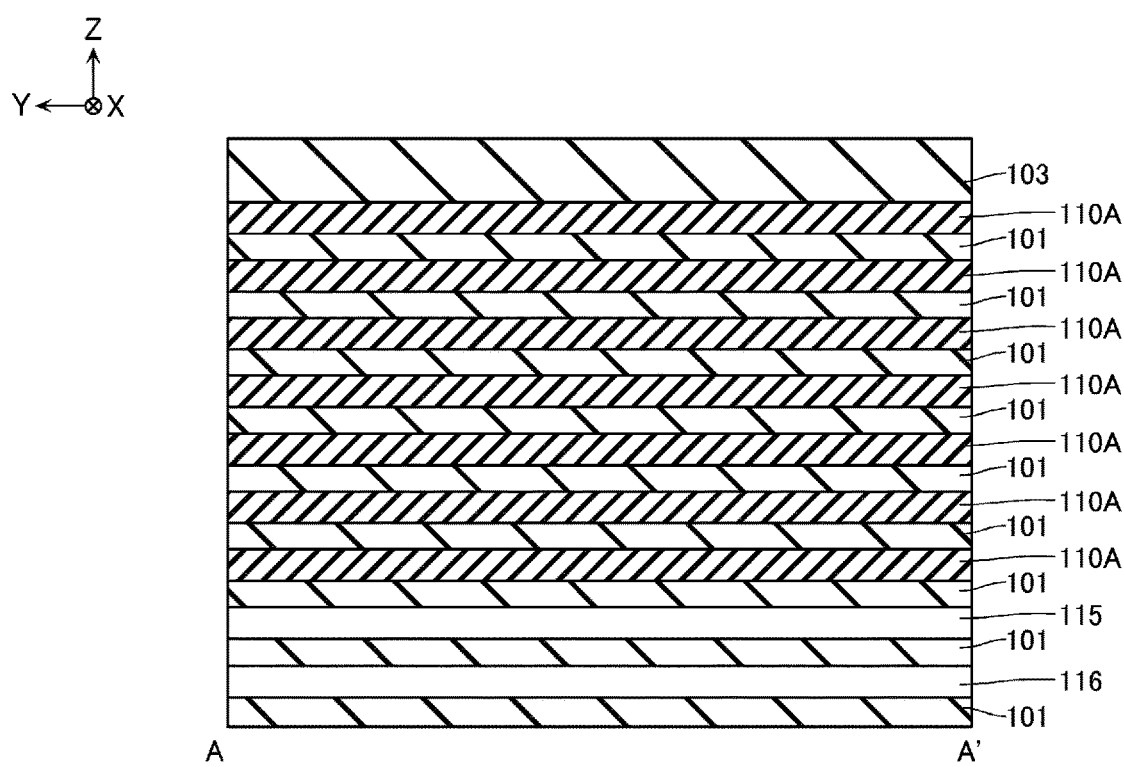
FIG. 12 is a schematic cross-sectional view illustrating the manufacturing method.

In the manufacturing method, as illustrated in FIGS. 11 and 12, on the semiconductor substrate 100, not illustrated, the semiconductor layer 116, the semiconductor layer 115, and sacrifice layers 110A are stacked alternately with the plural insulating layers 101. The sacrifice layers 110A are made of, for example, silicon nitride (SiN). The insulating layer 103 is made of, for example, silicon oxide (SiO$_2$). This step is performed by a method such as chemical vapor deposition (CVD).

Figure 13:
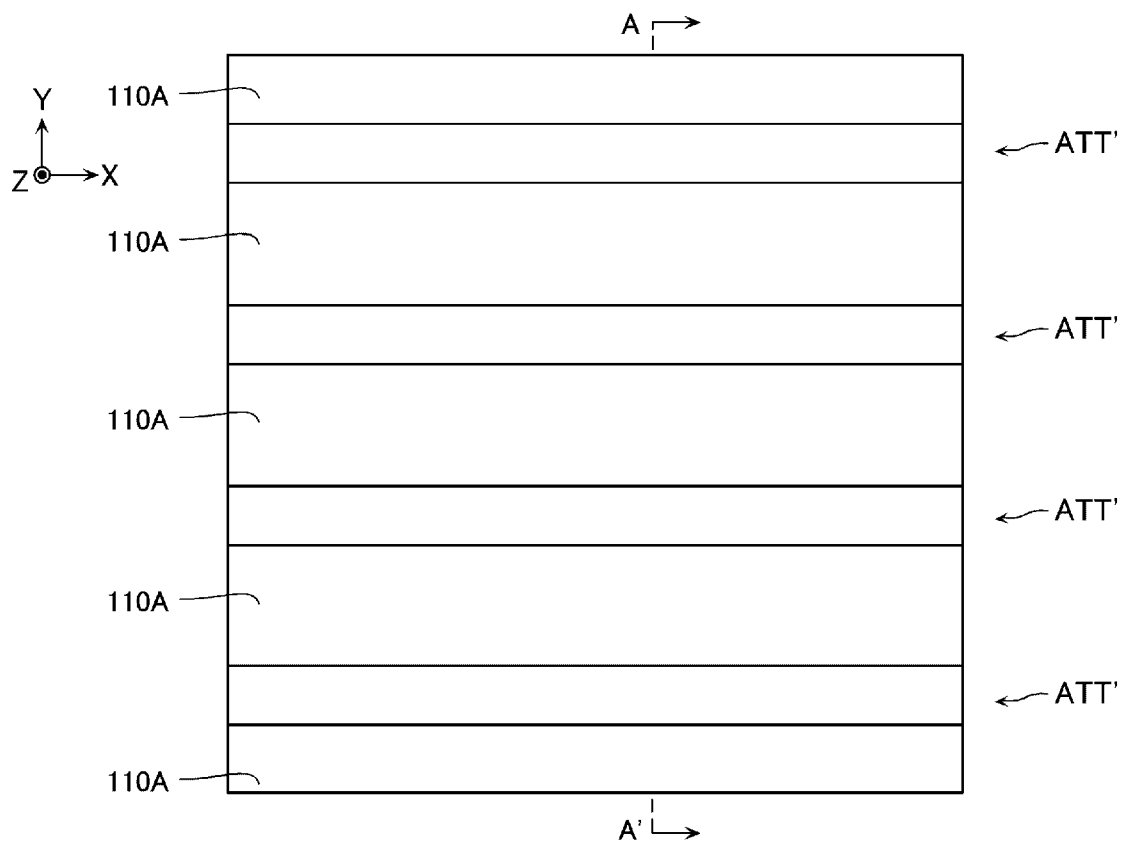
FIG. 13 is a schematic cross-sectional view illustrating the manufacturing method.
Figure 14:
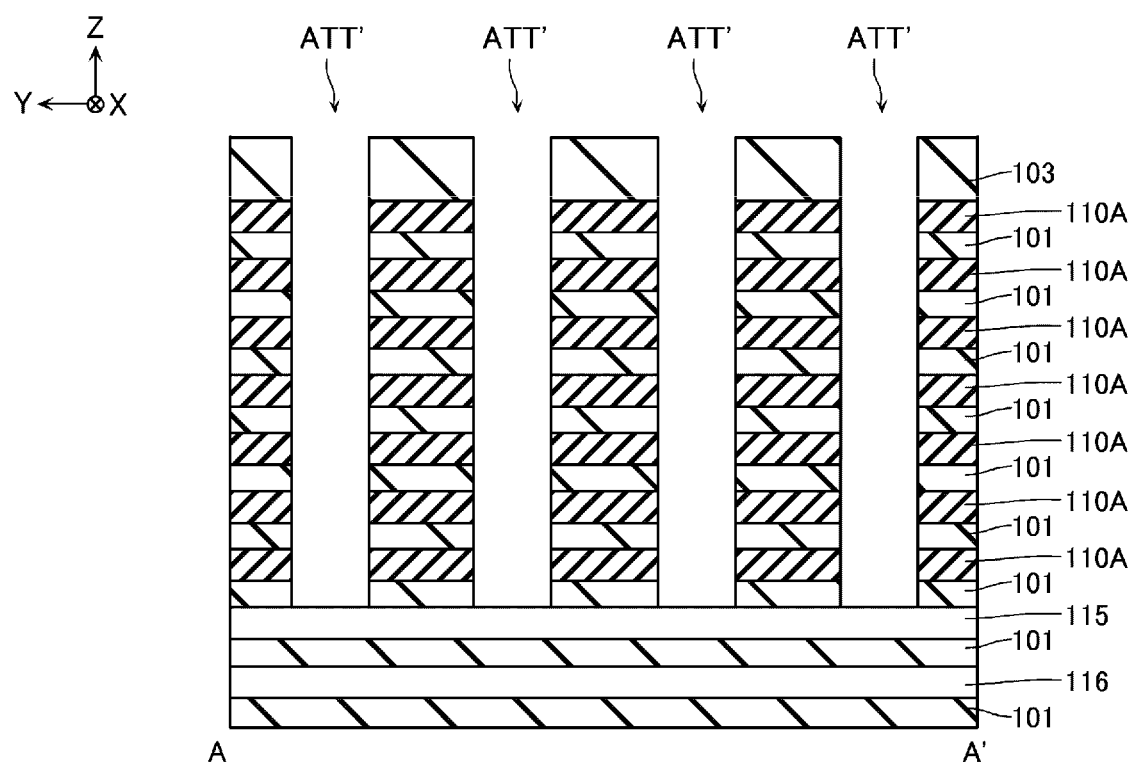
FIG. 14 is a schematic cross-sectional view illustrating the manufacturing method.
Figure 15:
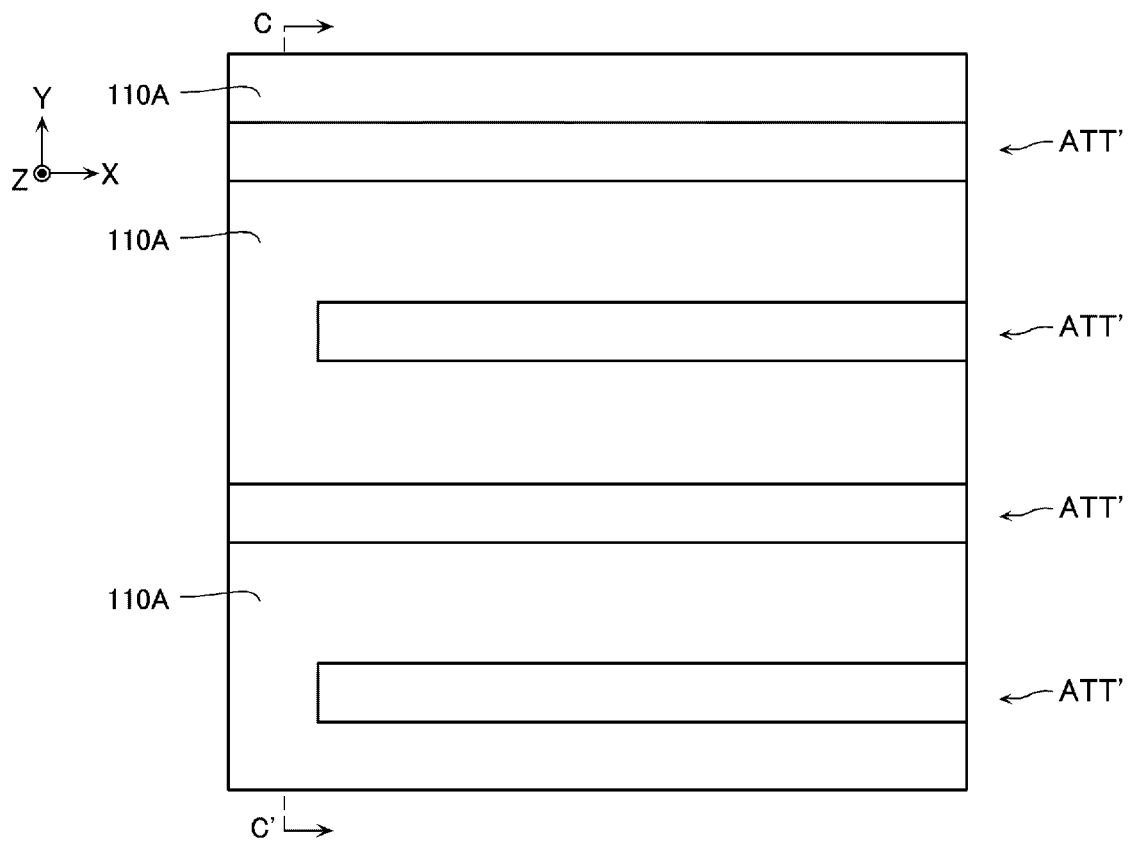
FIG. 15 is a schematic cross-sectional view illustrating the manufacturing method.
Figure 16:
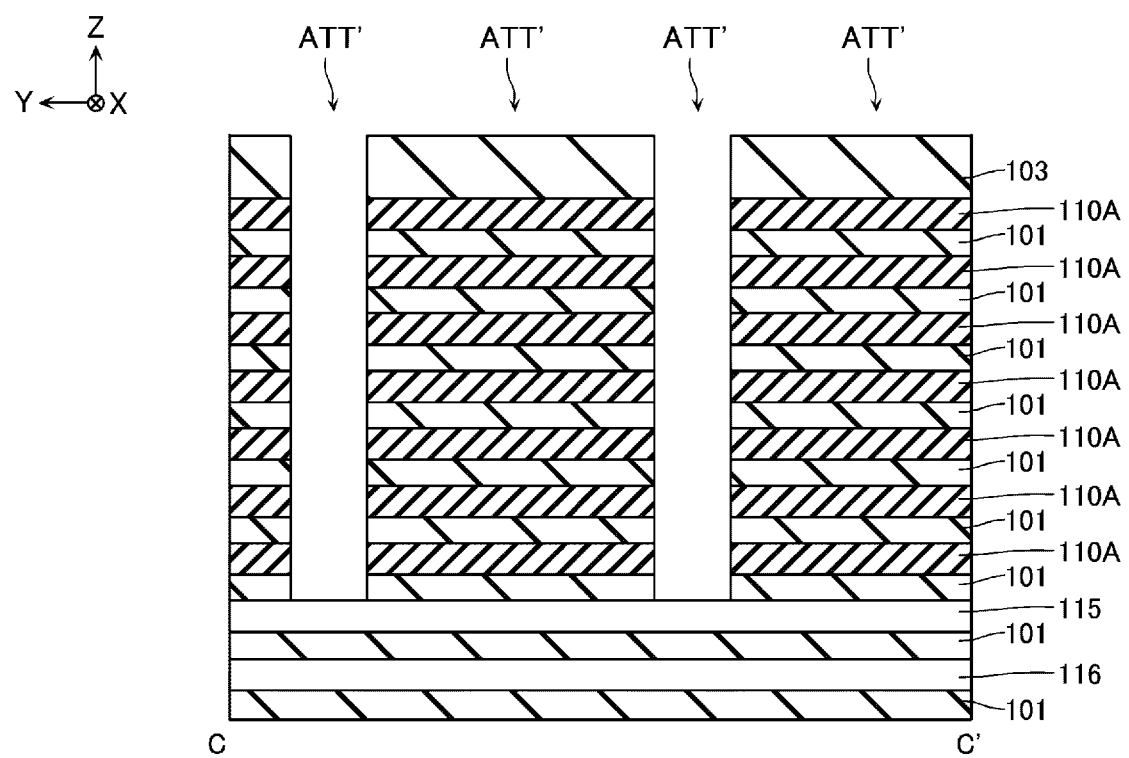
FIG. 16 is a schematic cross-sectional view illustrating the manufacturing method.

Next, as illustrated in FIGS. 13 to 16, trenches ATT' are formed in a stacked structure including the insulating layer 103, the insulating layers 101, and the sacrifice layers 110A. In this step, for example, an insulating layer having openings corresponding to the trenches ATT' is formed on an upper surface of the structure illustrated in FIG. 12, and reactive ion etching (RIE), for example, is performed using this insulating layer as a mask. As illustrated in FIGS. 13 and 15, the trenches ATT' extend for a predetermined length in the X direction, and the plural trenches ATT' are disposed at a predetermined interval. As illustrated in FIGS. 14 and 16, the trenches ATT' extend in the Z direction through the insulating layer 103, the plural insulating layers 101, and the plural sacrifice layers 110A so as to divide these components in the Y direction.

Figure 17:
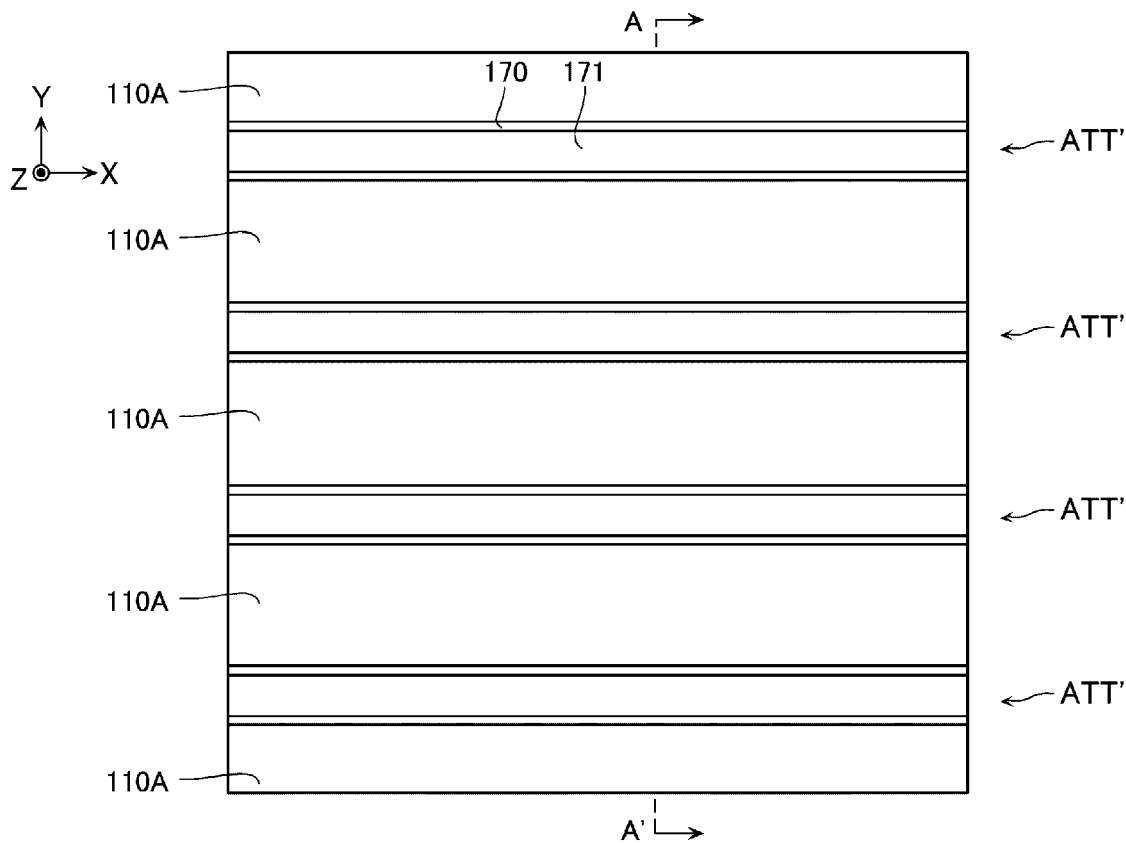
FIG. 17 is a schematic cross-sectional view illustrating the manufacturing method.
Figure 18:
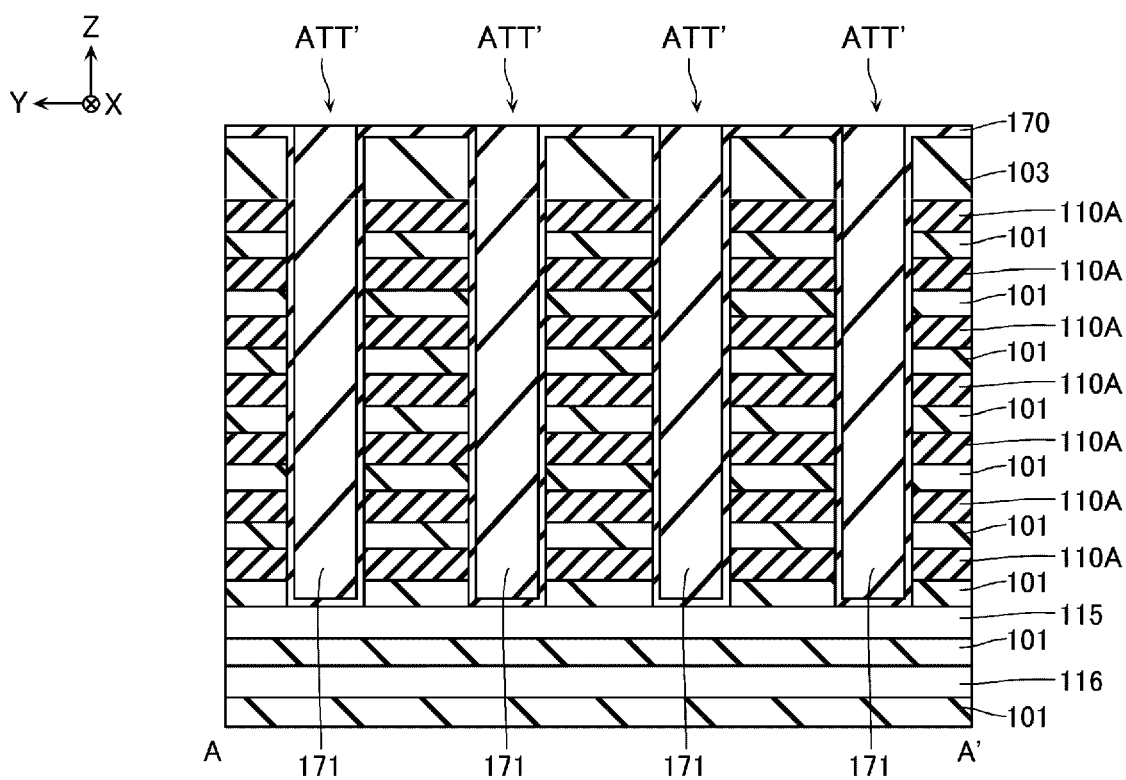
FIG. 18 is a schematic cross-sectional view illustrating the manufacturing method.

Next, as illustrated in FIGS. 17 and 18, an insulating layer 170 is deposited on an upper surface of the insulating layer 103, and bottom surfaces and side surfaces of the trenches ATT'. The insulating layer 170 is made of, for example, silicon oxide (SiO$_2$). This step is performed by a method such as CVD. Carbon films 171 to fill up the trenches ATT' are formed on an upper surface of the insulating layer 170. The carbon films 171 are formed by, for example, spin coating of an application carbon material. Upper portions of the carbon films 171 are removed to positions flush with the upper surface of the insulating layer 170. Removal of the carbon films 171 is performed by RIE, for example.

Figure 19:
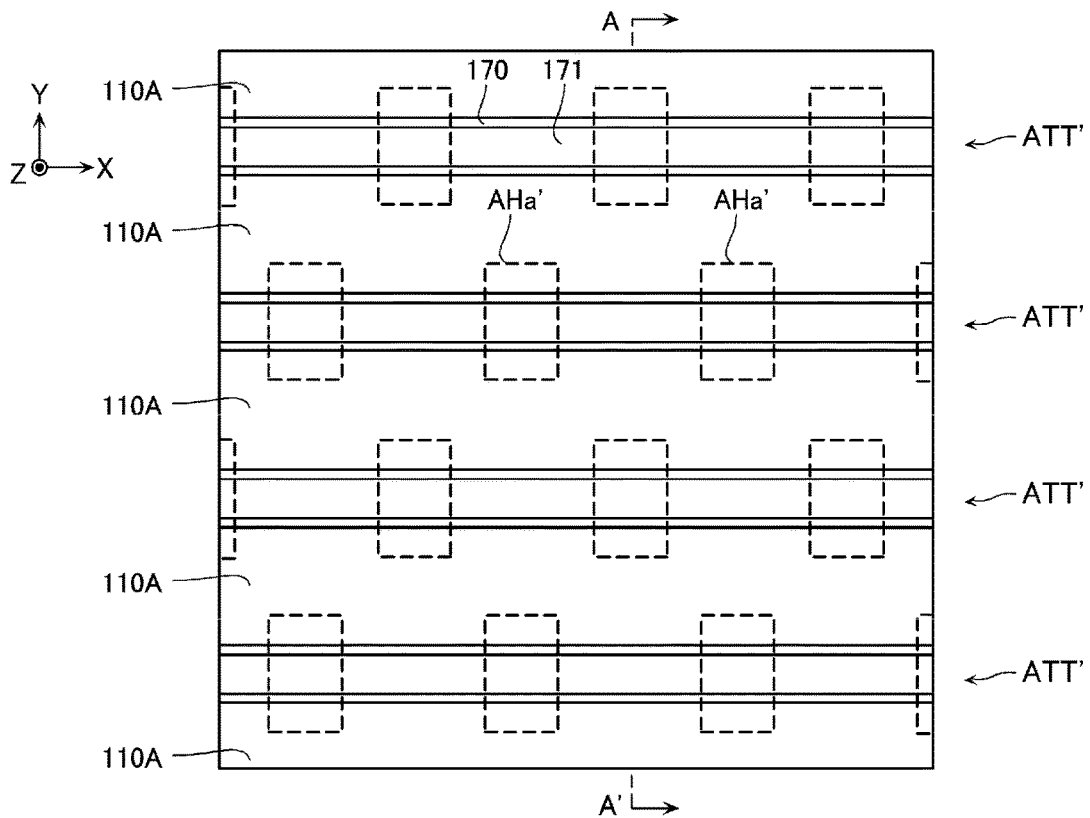
FIG. 19 is a schematic cross-sectional view illustrating the manufacturing method.
Figure 20:
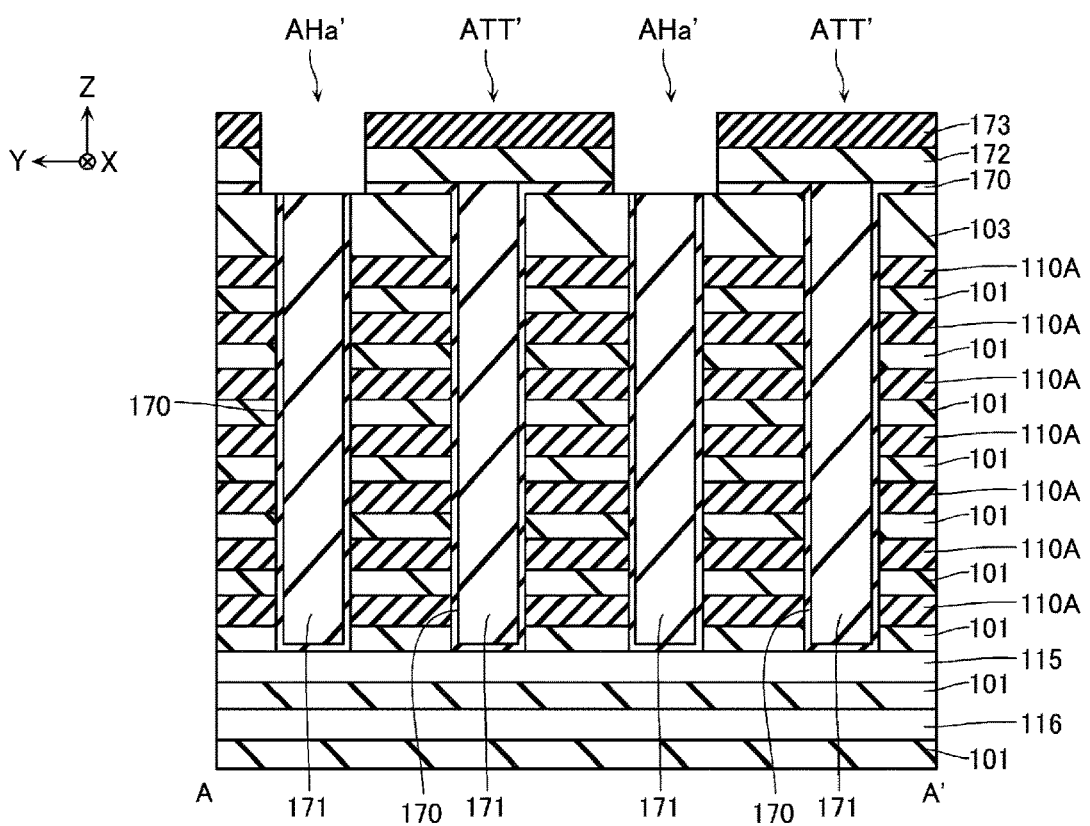
FIG. 20 is a schematic cross-sectional view illustrating the manufacturing method.

Next, as illustrated in FIGS. 19 and 20, a hard mask 172 and a resist 173 are formed on an upper surface of the structure illustrated in FIG. 18. The hard mask 172 is made of, for example, silicon oxide (SiO$_2$). The hard mask 172 is formed by a method such as CVD. The resist 173 is formed by, for example, spin coating of a resist material. Openings AHa' are formed using the resist 173 as a mask. The openings AHa' extend through the hard mask 172 and the insulating layer 170 so as to expose the carbon films 171. The openings AHa' are formed by a method such as photolithography and RIE.

Figure 21:
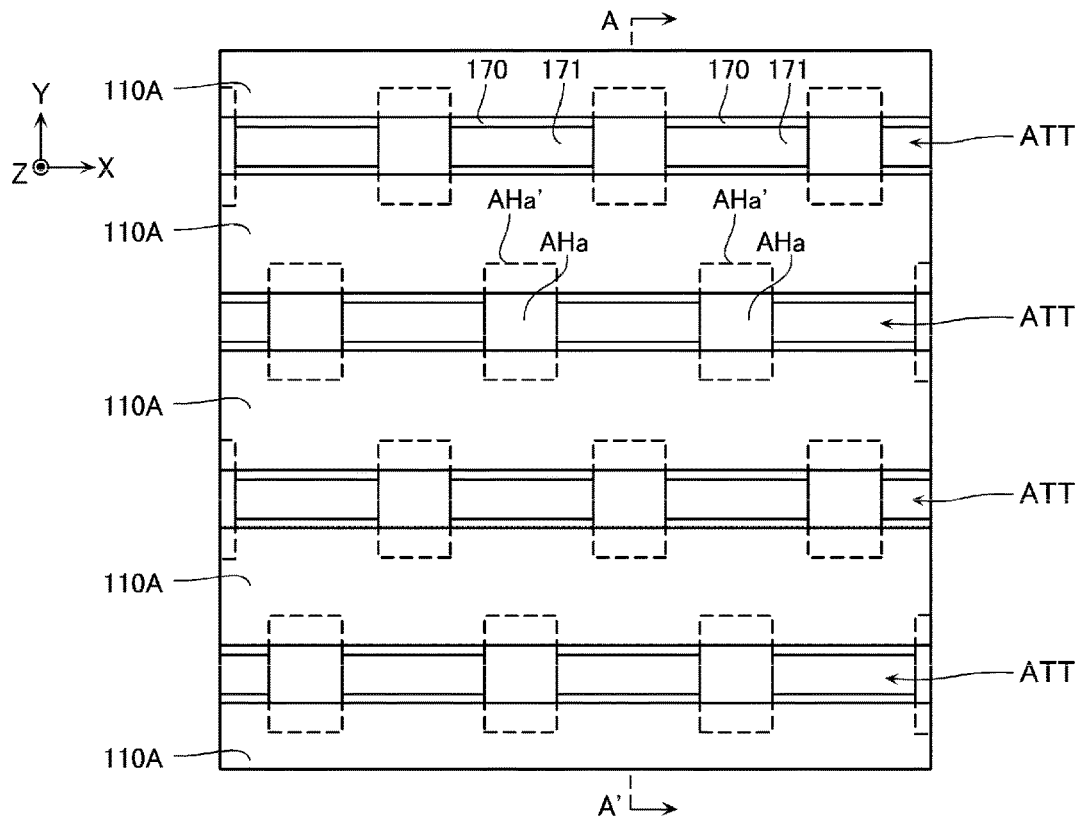
FIG. 21 is a schematic cross-sectional view illustrating the manufacturing method.
Figure 22:
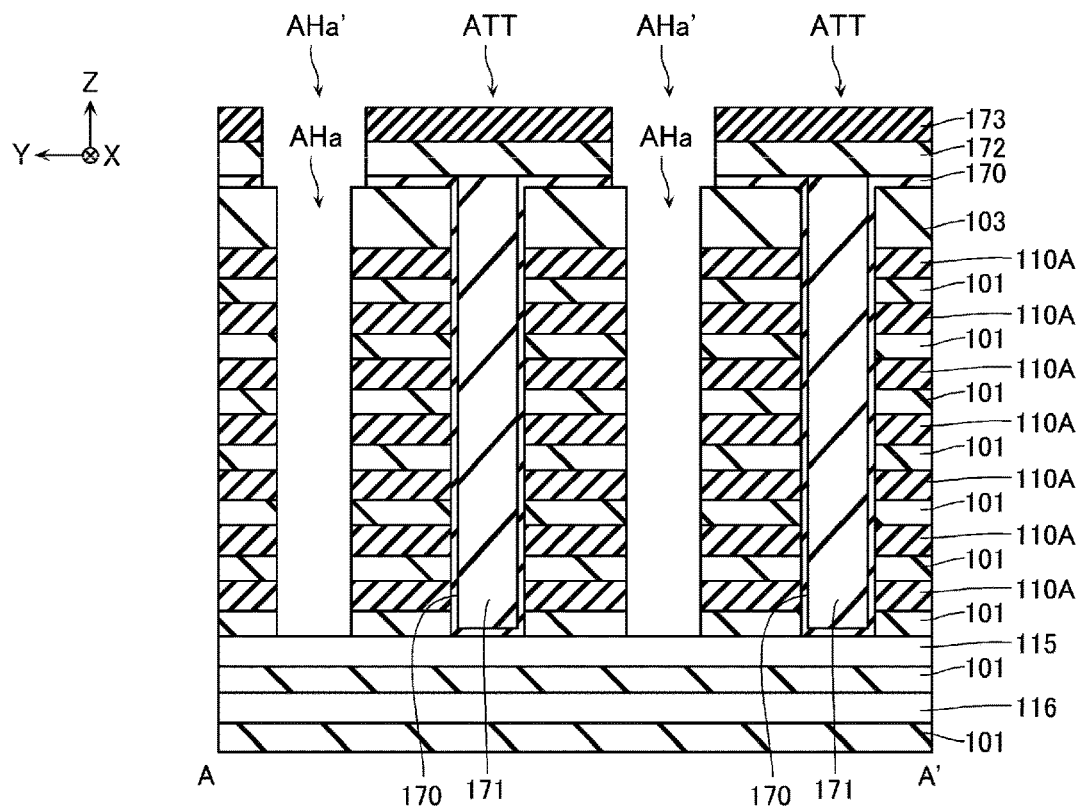
FIG. 22 is a schematic cross-sectional view illustrating the manufacturing method.

Next, as illustrated in FIGS. 21 and 22, portions of the carbon films 171 and the insulating layer 170 that correspond to the openings AHa' are removed to form openings AHa. A step of removing the carbon films 171 is performed by RIE, for example. A step of removing the insulating layer 170 is performed by chemical dry etching, for example. In the following description, plural portions of the trenches ATT' that are defined by the plural openings AHa disposed in the X direction will be referred to as trenches ATT.

Figure 23:
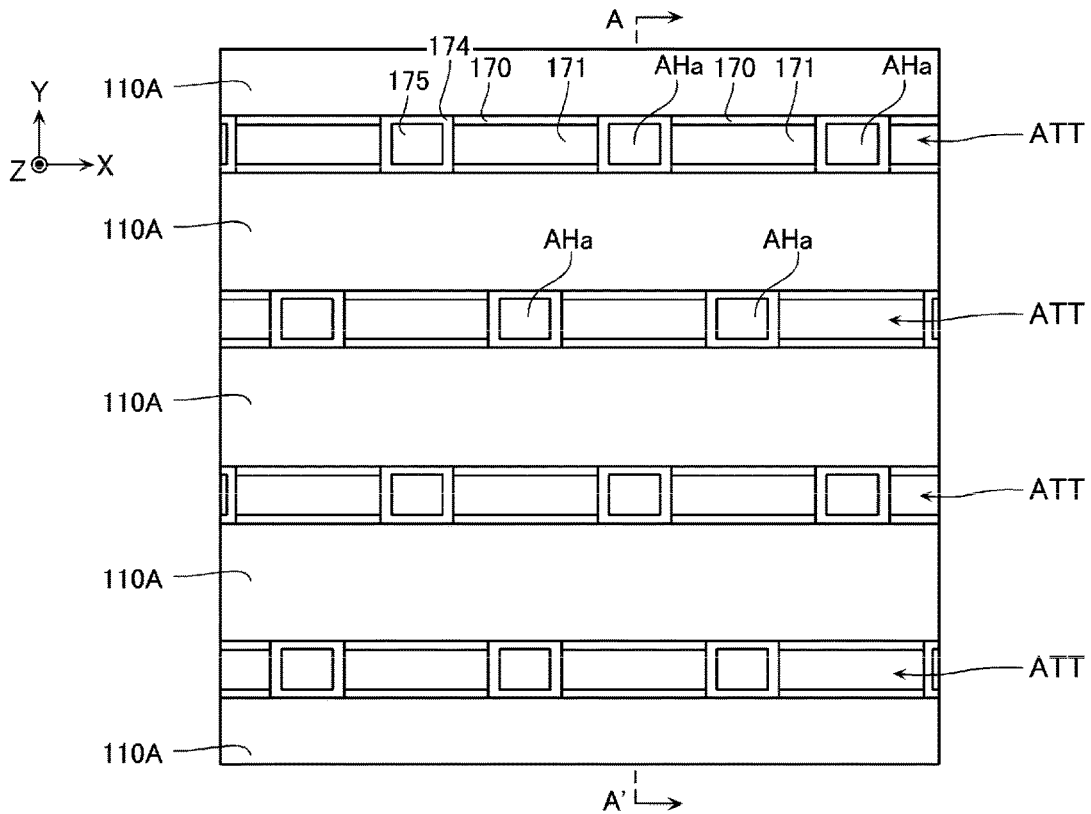
FIG. 23 is a schematic cross-sectional view illustrating the manufacturing method.
Figure 24:
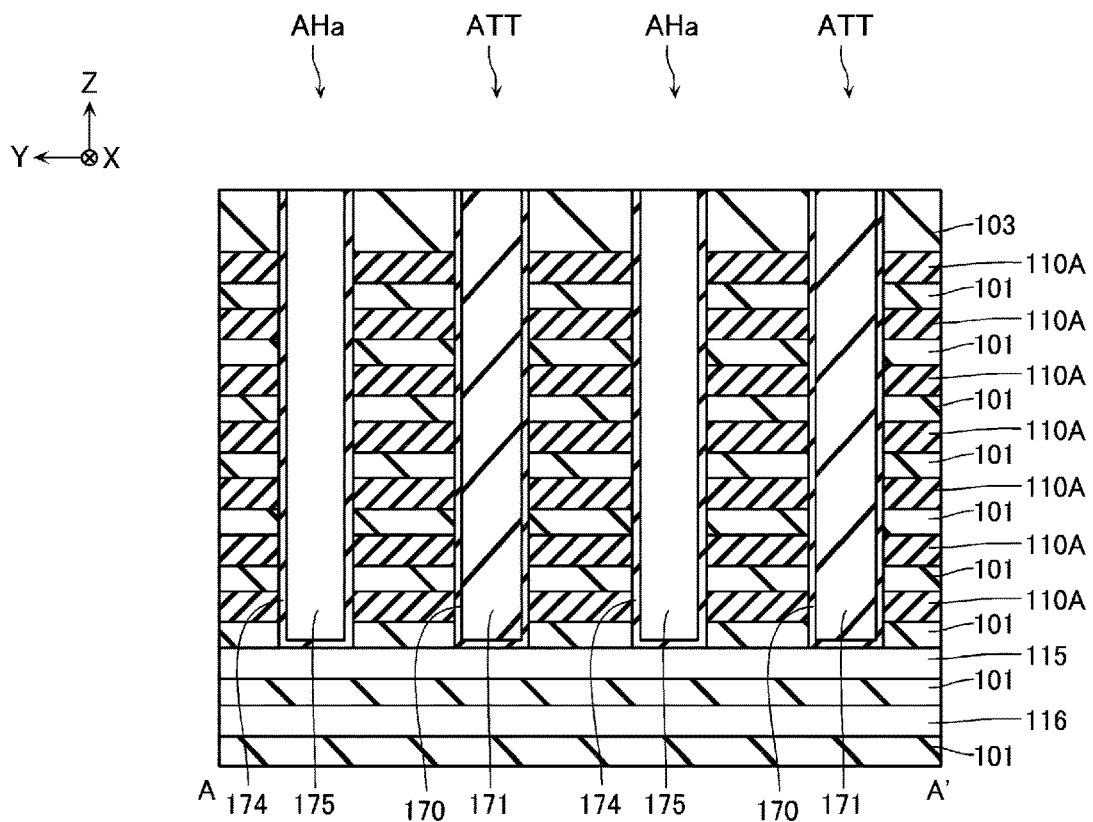
FIG. 24 is a schematic cross-sectional view illustrating the manufacturing method.

Next, as illustrated in FIGS. 23 and 24, the resist 173, the hard mask 172, and the insulating layer 170 are removed from an upper surface of the structure illustrated in FIG. 22. This step is performed by a method such as asking and RIE.

Insulating layers 174 of silicon oxide (SiO$_2$), for example, are deposited on bottom surfaces and side surfaces of the openings AHa. Semiconductor layers 175 of amorphous silicon (Si), for example, to fill up the openings AHa are formed on upper surfaces of the insulating layers 174. The insulating layers 174 and the semiconductor layers 175 are formed by a method such as CVD. Upper portions of the insulating layers 174 and the semiconductor layers 175 are removed to positions flush with the upper surface of the insulating layer 103. Removal of the insulating layers 174 and the semiconductor layers 175 is performed by RIE, for example.

Figure 25:
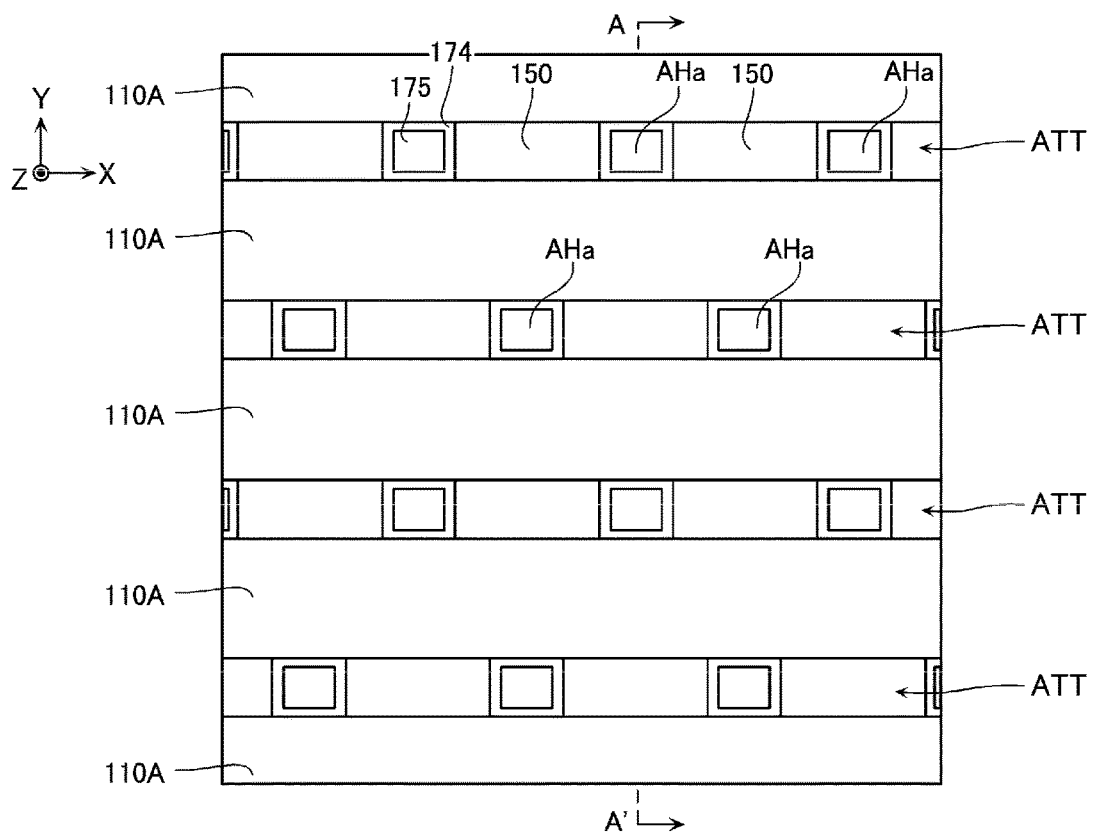
FIG. 25 is a schematic cross-sectional view illustrating the manufacturing method.
Figure 26:
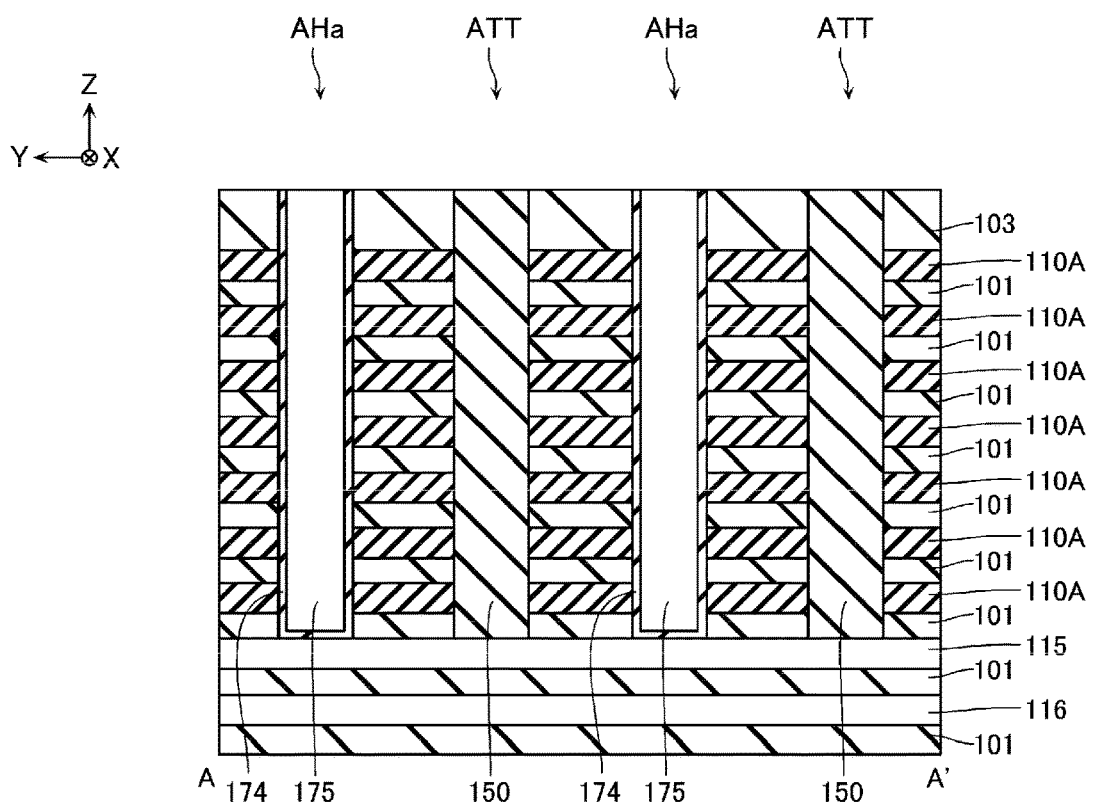
FIG. 26 is a schematic cross-sectional view illustrating the manufacturing method.

Next, as illustrated in FIGS. 25 and 26, the carbon films 171 and the insulating layer 170 are removed from inside of the trenches ATT. This step is performed by a method such as asking and RIE. The insulating layers 150 are formed inside the trenches ATT, and upper surfaces of the insulating layers 150 are removed to positions flush with the upper surface of the insulating layer 103. This step is performed by a method such as CVD and RIE.

Figure 27:
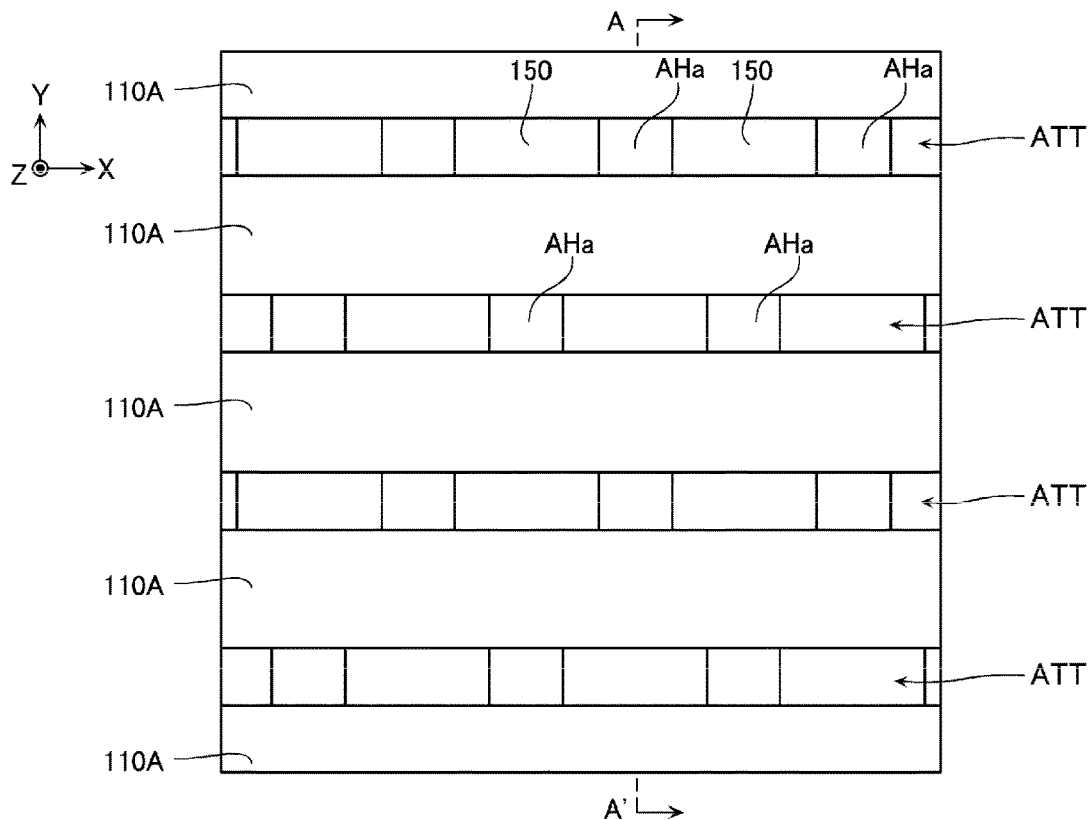
FIG. 27 is a schematic cross-sectional view illustrating the manufacturing method.
Figure 28:
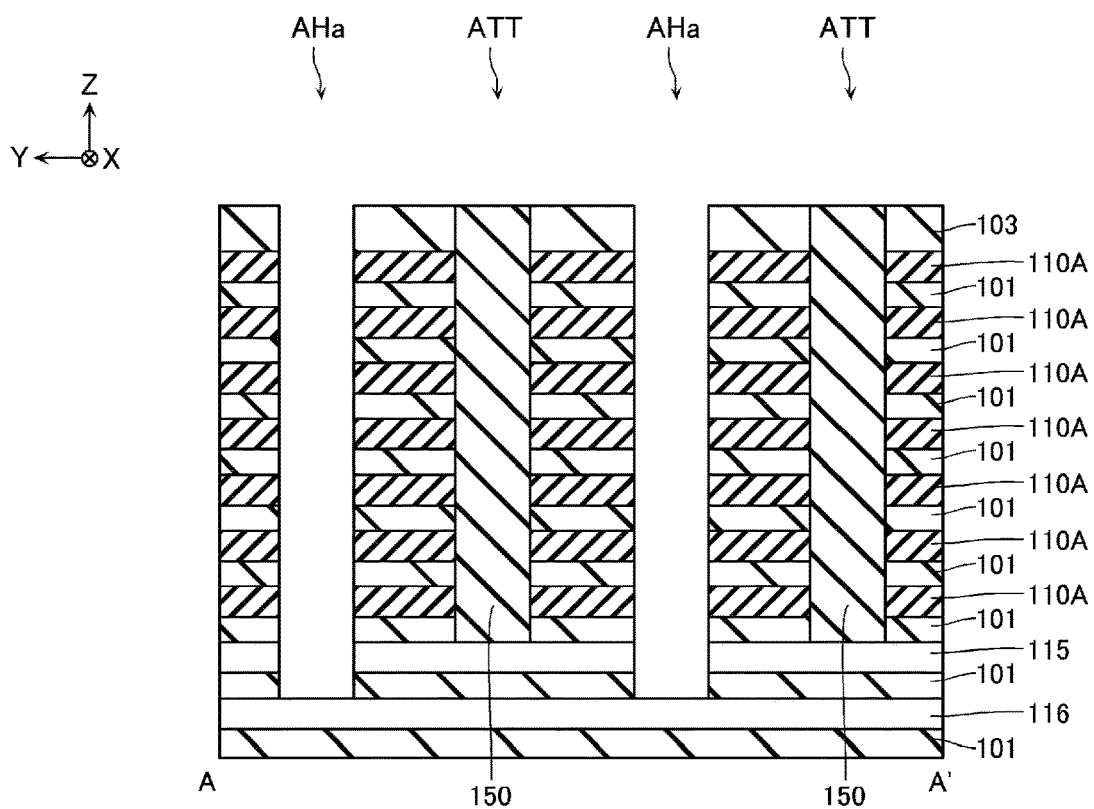
FIG. 28 is a schematic cross-sectional view illustrating the manufacturing method.

Next, as illustrated in FIGS. 27 and 28, the semiconductor layers 175 are removed from inside of the openings AHa. This step is performed by wet etching, for example. The insulating layers 174 are removed from the inside of the openings AHa, and bottom portions of the openings AHa are further removed to make positions of bottom surfaces of the openings AHa flush with a position of an upper surface of the semiconductor layer 116. This step is performed by RIE, for example.

Figure 29:
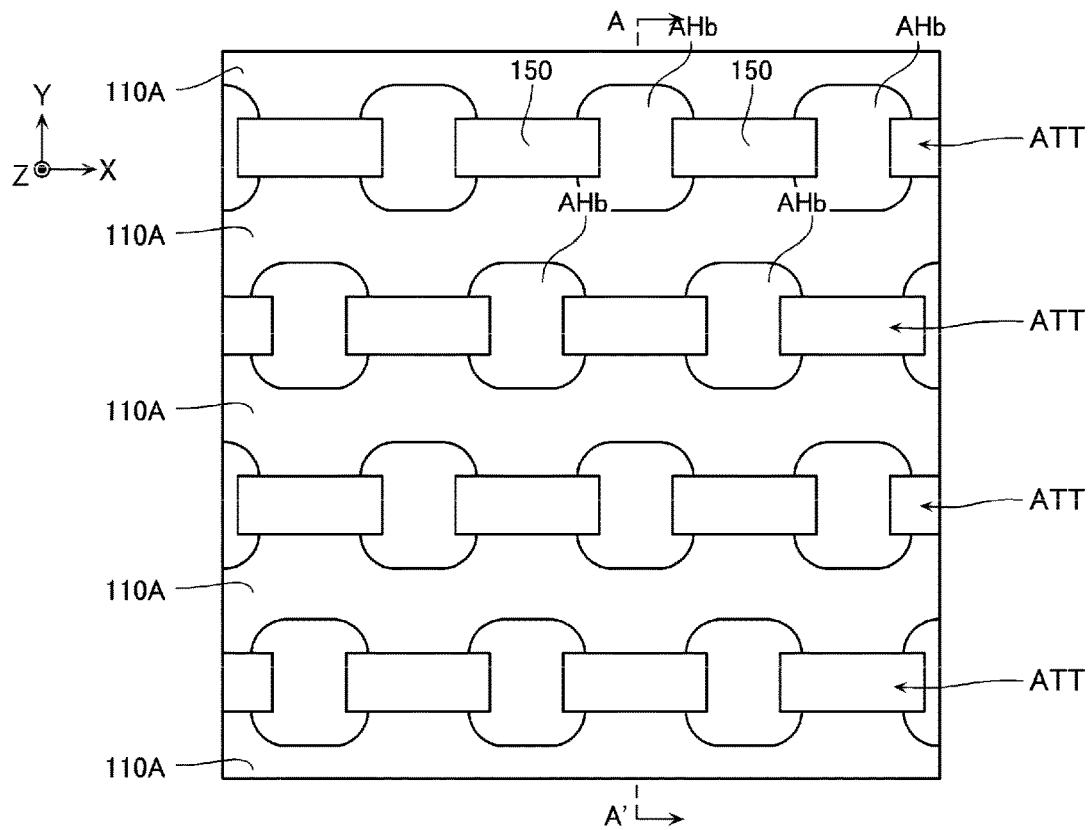
FIG. 29 is a schematic cross-sectional view illustrating the manufacturing method.
Figure 30:
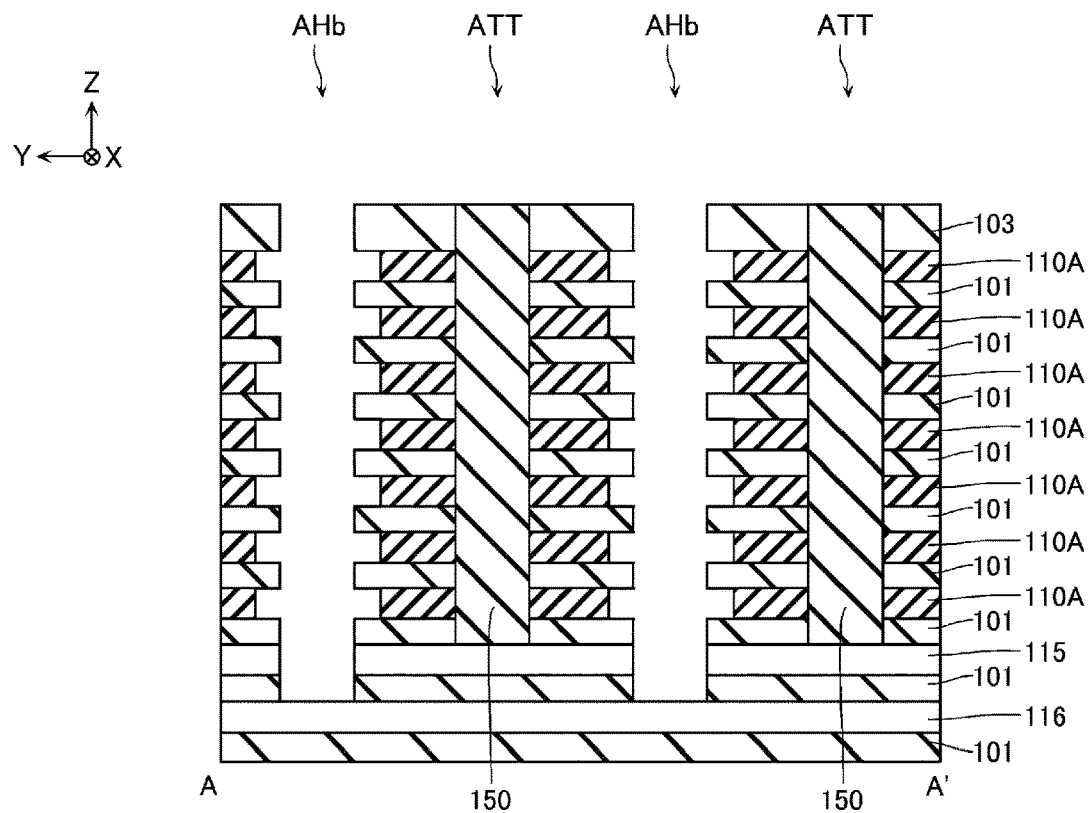
FIG. 30 is a schematic cross-sectional view illustrating the manufacturing method.

Next, as illustrated in FIGS. 29 and 30, the sacrifice layers 110A are partly removed via the openings AHa so as to form openings AHb. As a result of this step, portions of upper surfaces and lower surfaces of the insulating layers 101 that are located in the vicinity of the openings AHa are exposed. This step is performed by wet etching, for example.

Figure 31:
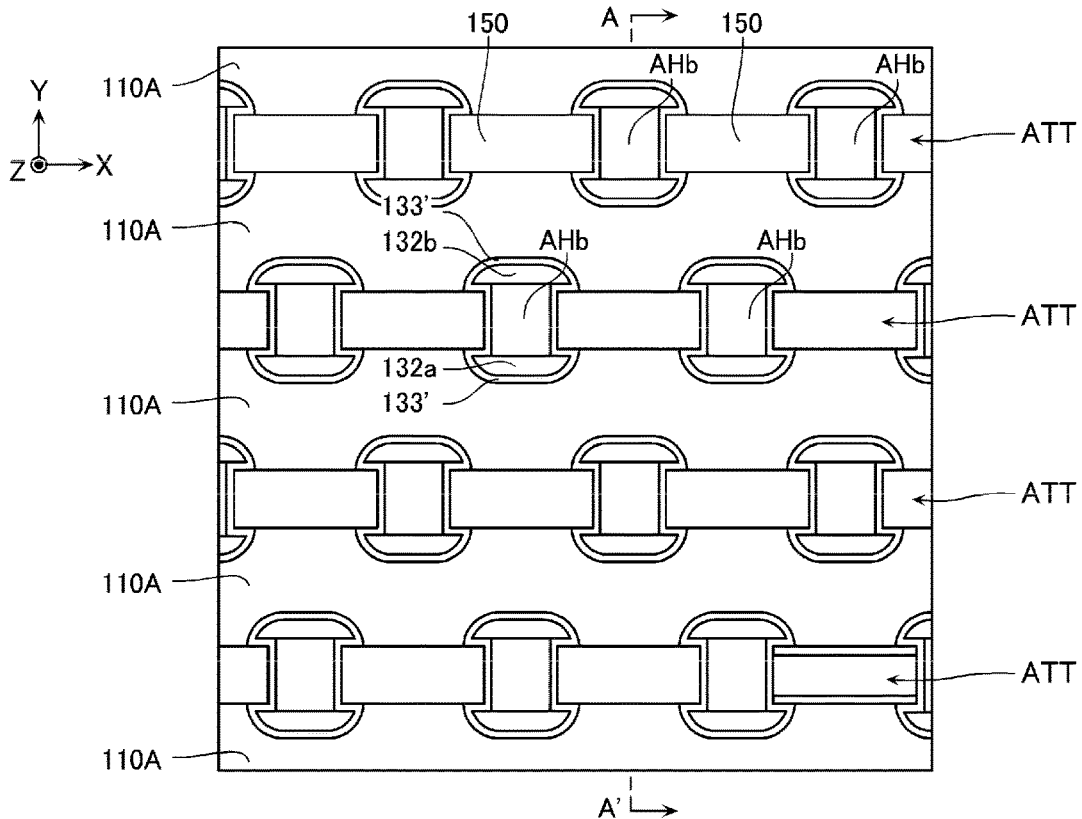
FIG. 31 is a schematic cross-sectional view illustrating the manufacturing method.
Figure 32:
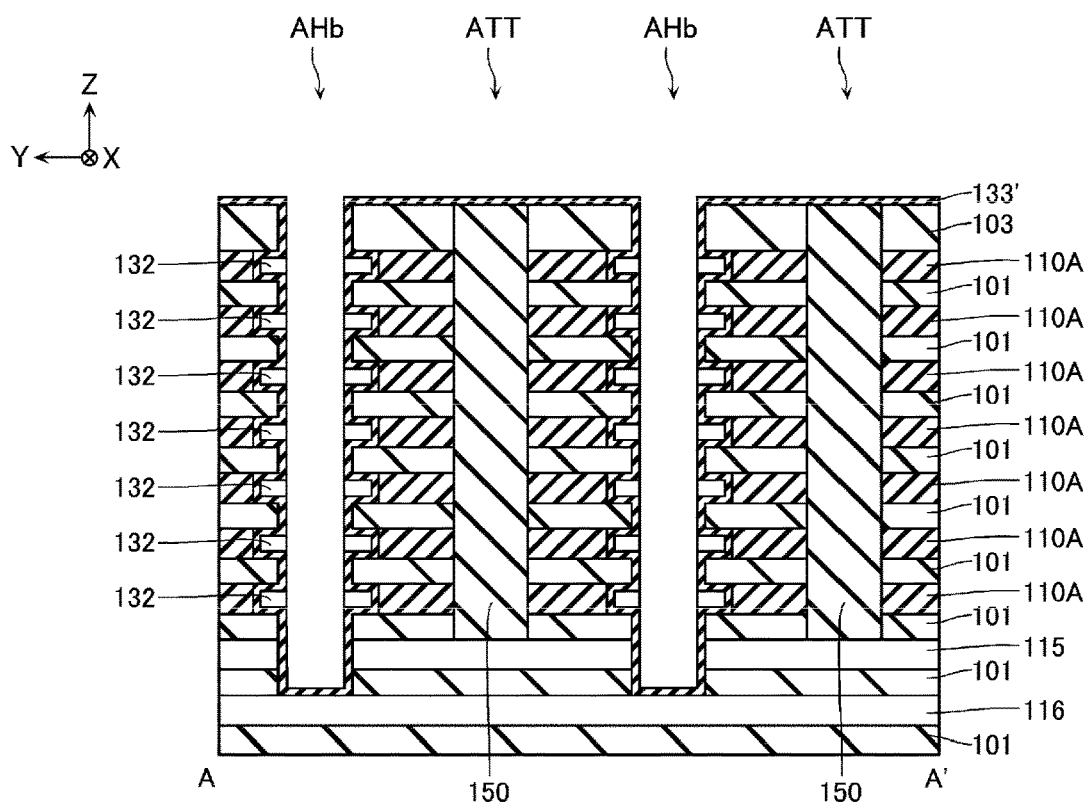
FIG. 32 is a schematic cross-sectional view illustrating the manufacturing method.

Next, as illustrated in FIGS. 31 and 32, an insulating layer 133' and the charge storage layers 132 are formed in sequence on side surfaces of the openings AHb via the openings AHb. The insulating layer 133' is formed by depositing the insulating layer 136, the high dielectric layer 135, and the insulating layer 134, not illustrated, in sequence. Via the openings AHb, semiconductor layers made of polycrystal silicon (Si), for example, which is the same material as the charge storage layers 132, are deposited on the side surfaces of the openings AHb. Thereafter, the semiconductor layers are partly removed to form the plural charge storage layers 132 disposed in the Z direction at positions corresponding to the sacrifice layers 110A. This step is performed by a method such as CVD and wet etching.

Figure 33:
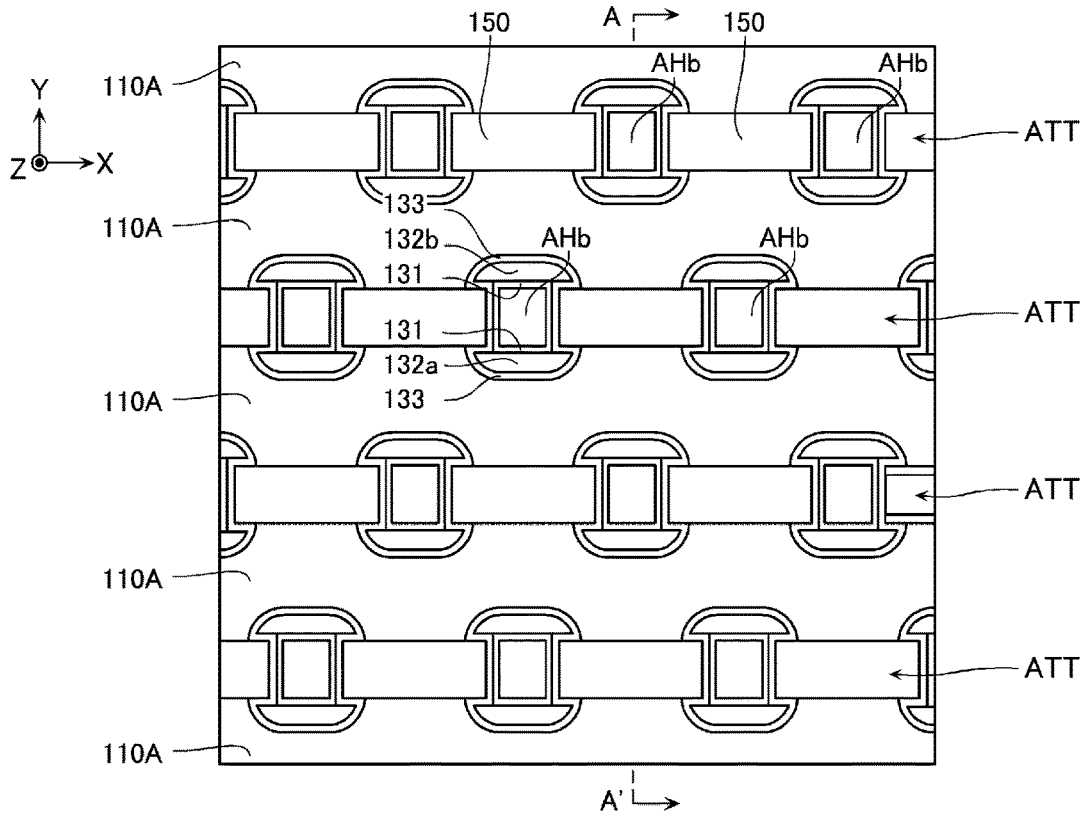
FIG. 33 is a schematic cross-sectional view illustrating the manufacturing method.
Figure 34:
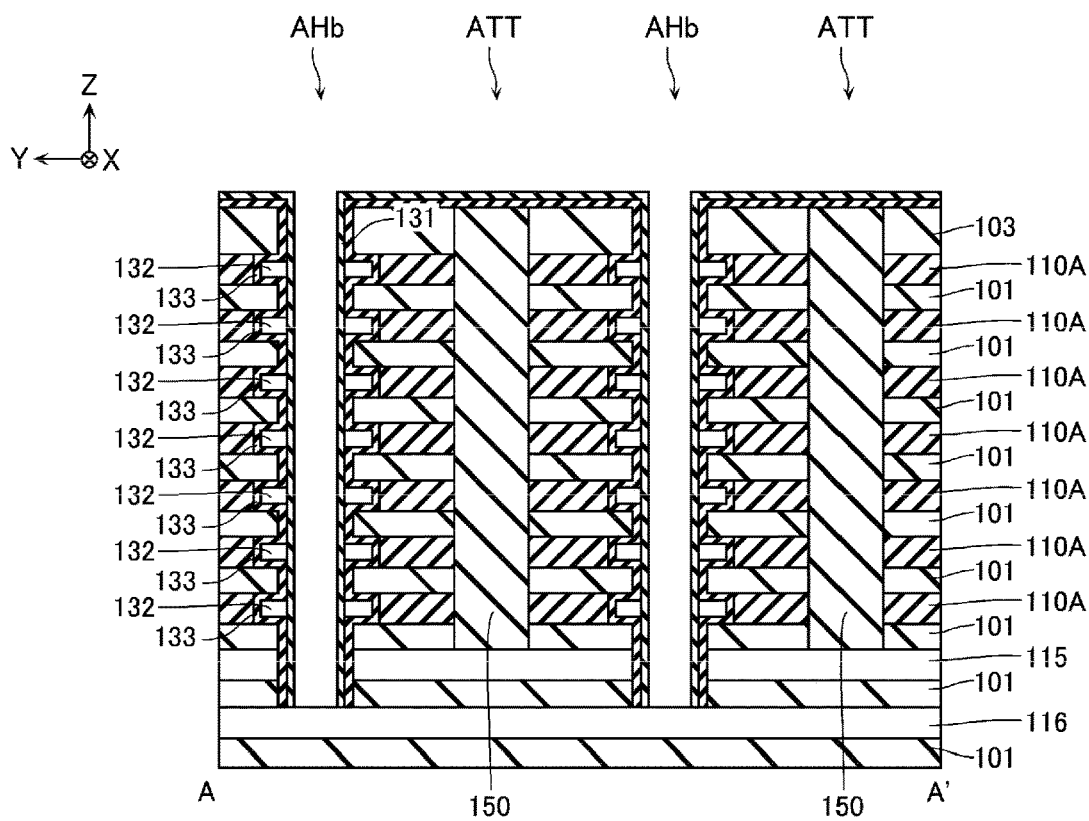
FIG. 34 is a schematic cross-sectional view illustrating the manufacturing method.

Next, as illustrated in FIGS. 33 and 34, the tunnel insulating layers 131 are formed on inner peripheral surfaces of the openings AHb. Portions of the tunnel insulating layers 131 and the insulating layers 133' that cover bottom surfaces of the openings AHb are removed to form the block insulating layers 133. This step is performed by a method such as CVD and RIE.

Figure 35:
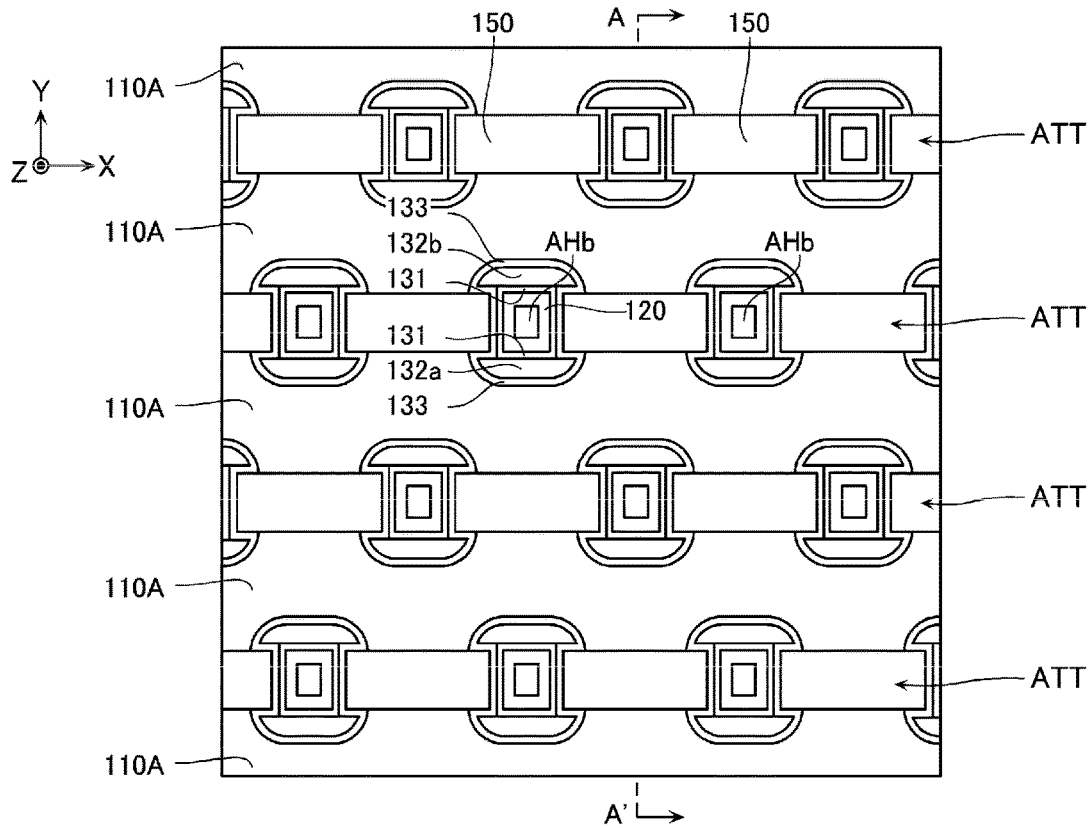
FIG. 35 is a schematic cross-sectional view illustrating the manufacturing method.
Figure 36:
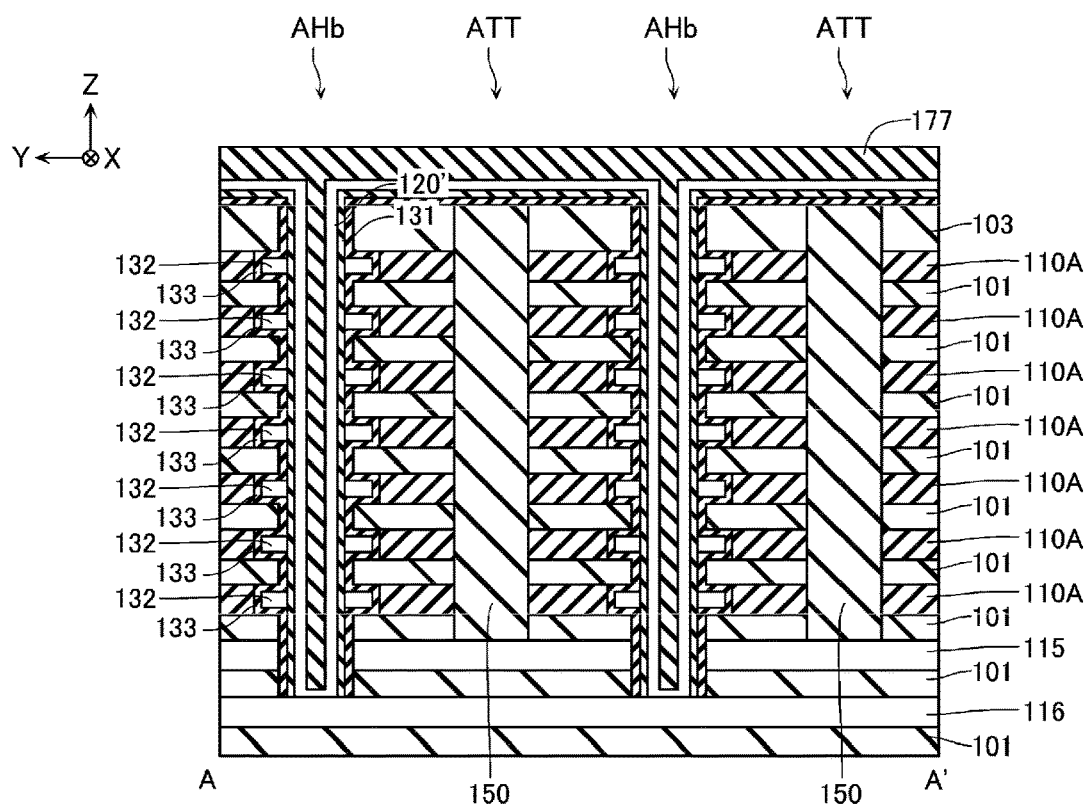
FIG. 36 is a schematic cross-sectional view illustrating the manufacturing method.

Next, as illustrated in FIGS. 35 and 36, a semiconductor layer 120' and an insulating layer 177 are formed in the openings AHb. This step is performed by CVD, for example.

Figure 37:
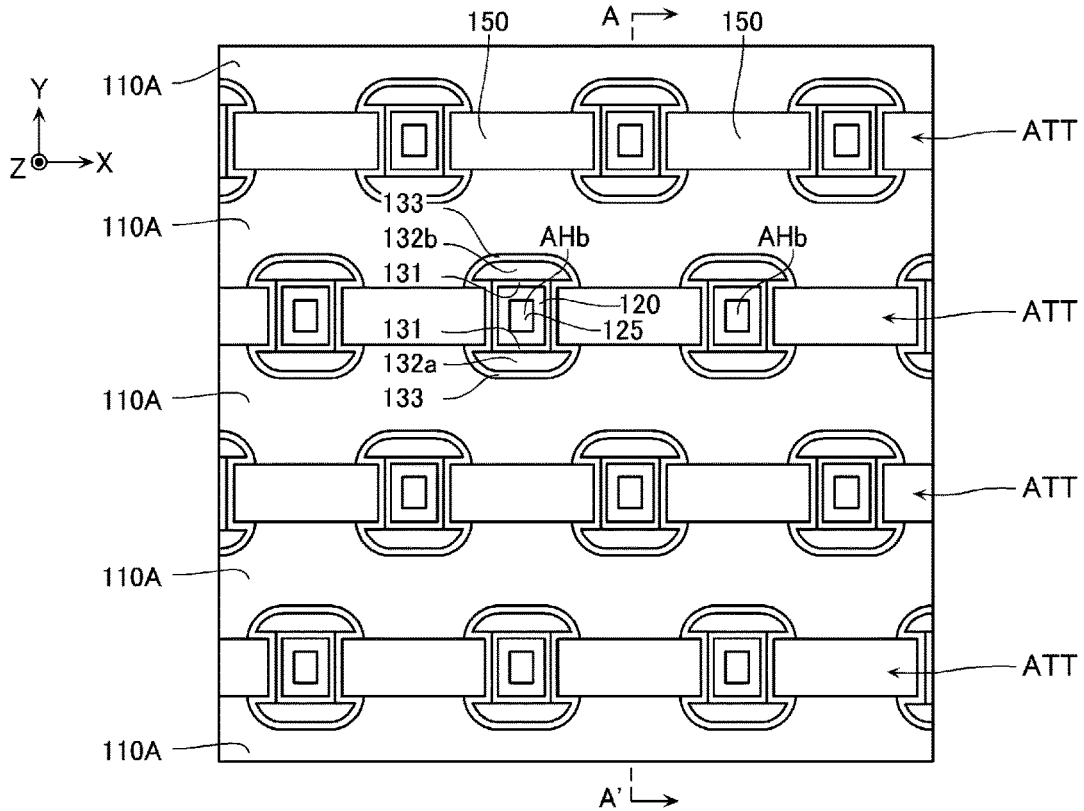
FIG. 37 is a schematic cross-sectional view illustrating the manufacturing method.
Figure 38:
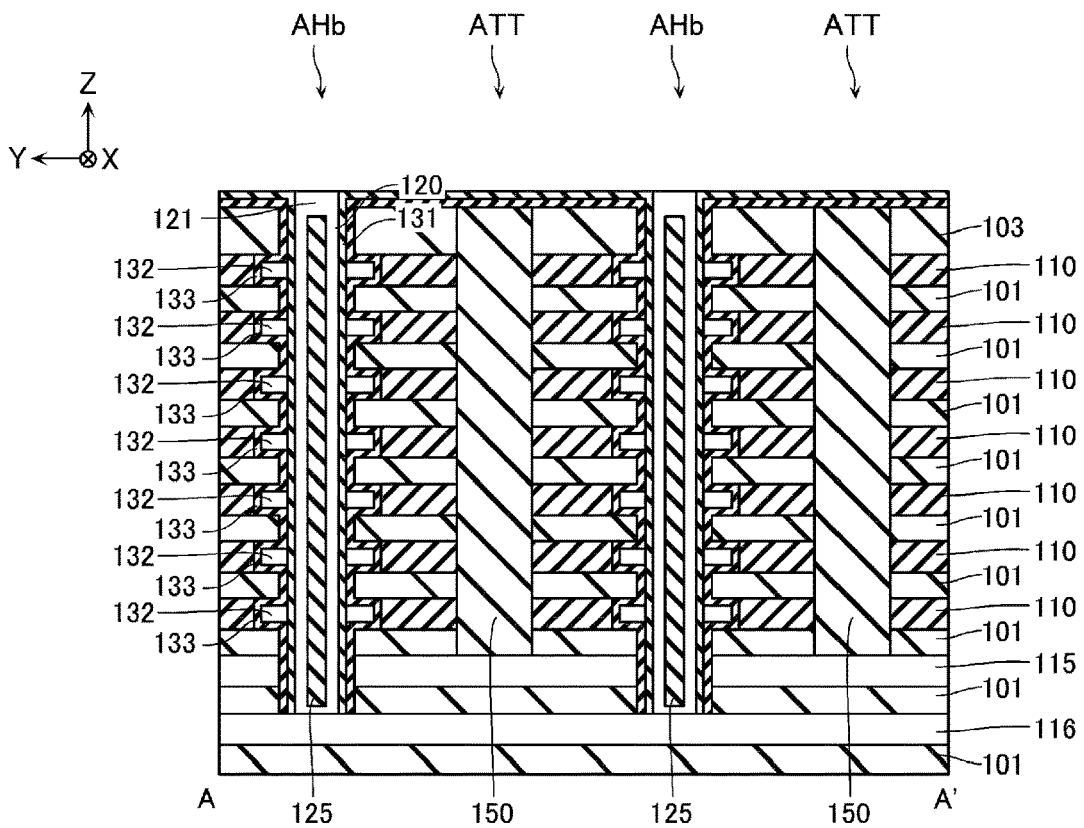
FIG. 38 is a schematic cross-sectional view illustrating the manufacturing method.
Figure 39:
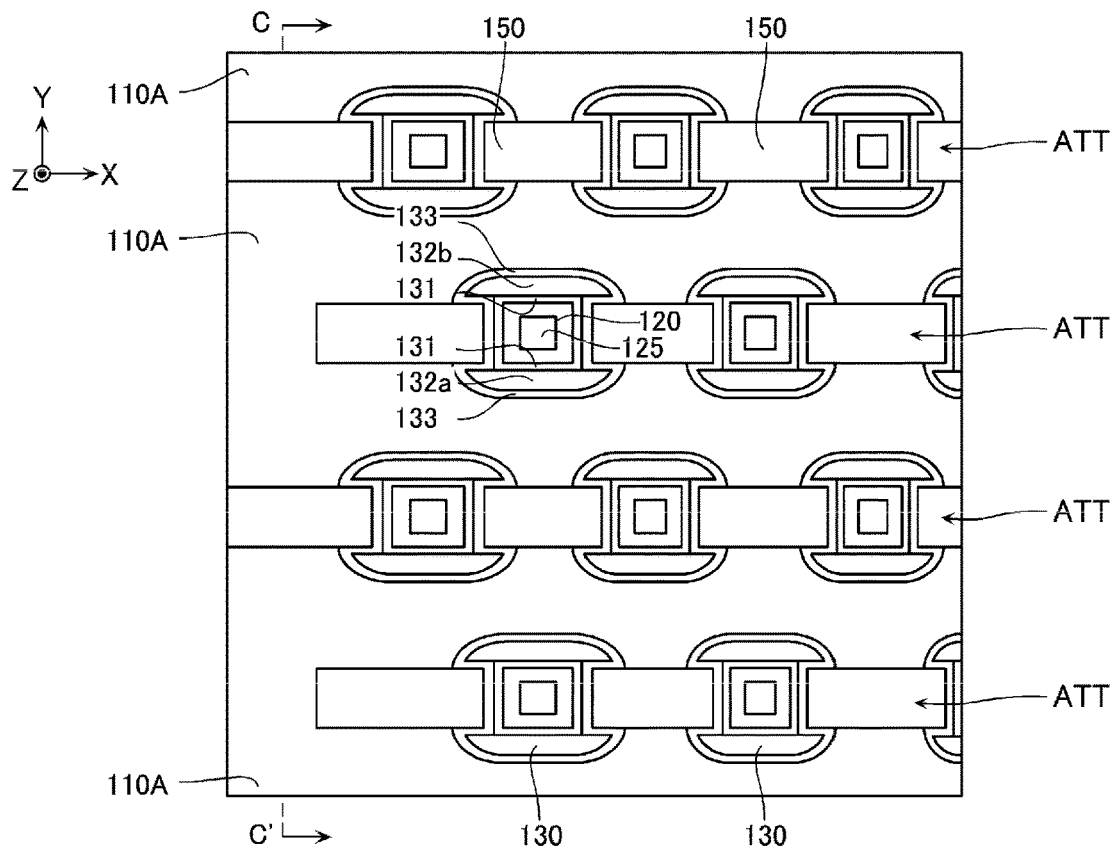
FIG. 39 is a schematic cross-sectional view illustrating the manufacturing method.
Figure 40:
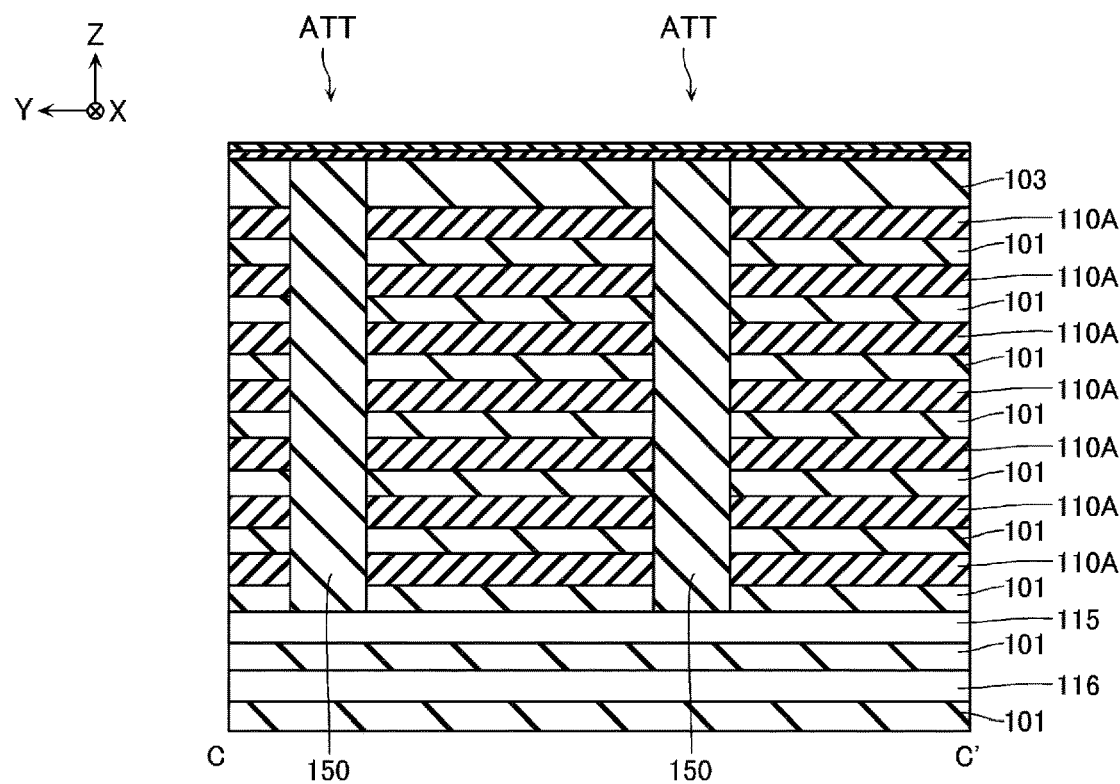
FIG. 40 is a schematic cross-sectional view illustrating the manufacturing method.

Next, as illustrated in FIGS. 37 and 38, inside the openings AHb, part of the insulating layer 177 is removed to positions below the upper surface of the insulating layer 103 to form the insulating layers 125. Inside the openings AHb, part of the semiconductor layer 120' is removed to form the semiconductor layers 121 above the semiconductor layer 120'. This step is performed by a method such as RIE and CVD. It is noted that after the steps described so far, as illustrated in FIGS. 39 and 40, regions where the sacrifice layers 110A are not divided in the Y direction remain between the trenches ATT adjacent to each other in the X direction.

Figure 41:
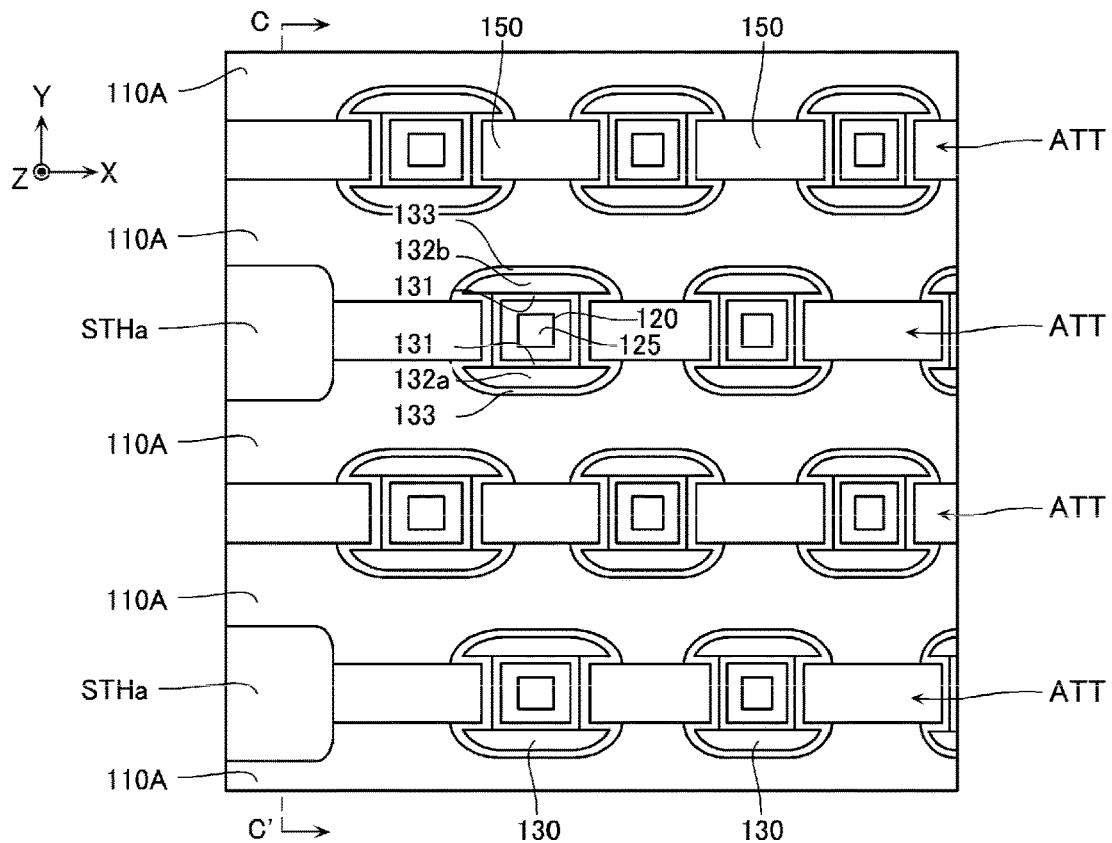
FIG. 41 is a schematic cross-sectional view illustrating the manufacturing method.
Figure 42:
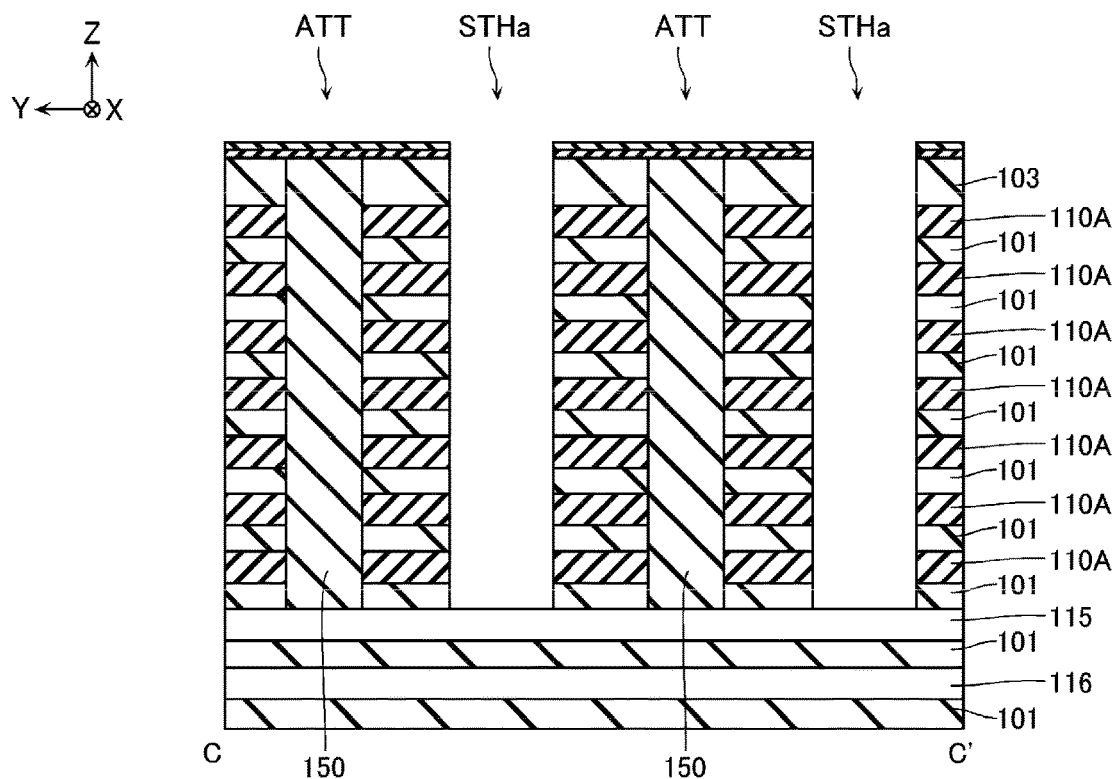
FIG. 42 is a schematic cross-sectional view illustrating the manufacturing method.
Figure 43:
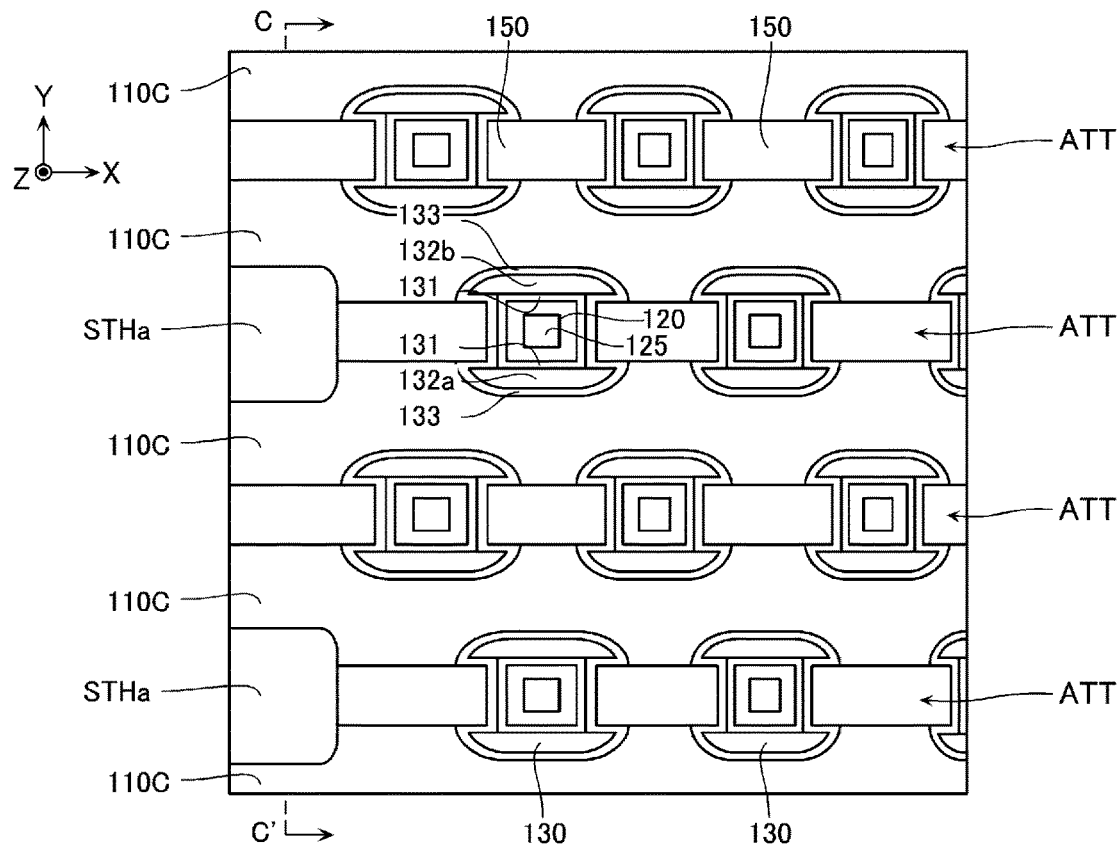
FIG. 43 is a schematic cross-sectional view illustrating the manufacturing method.
Figure 44:
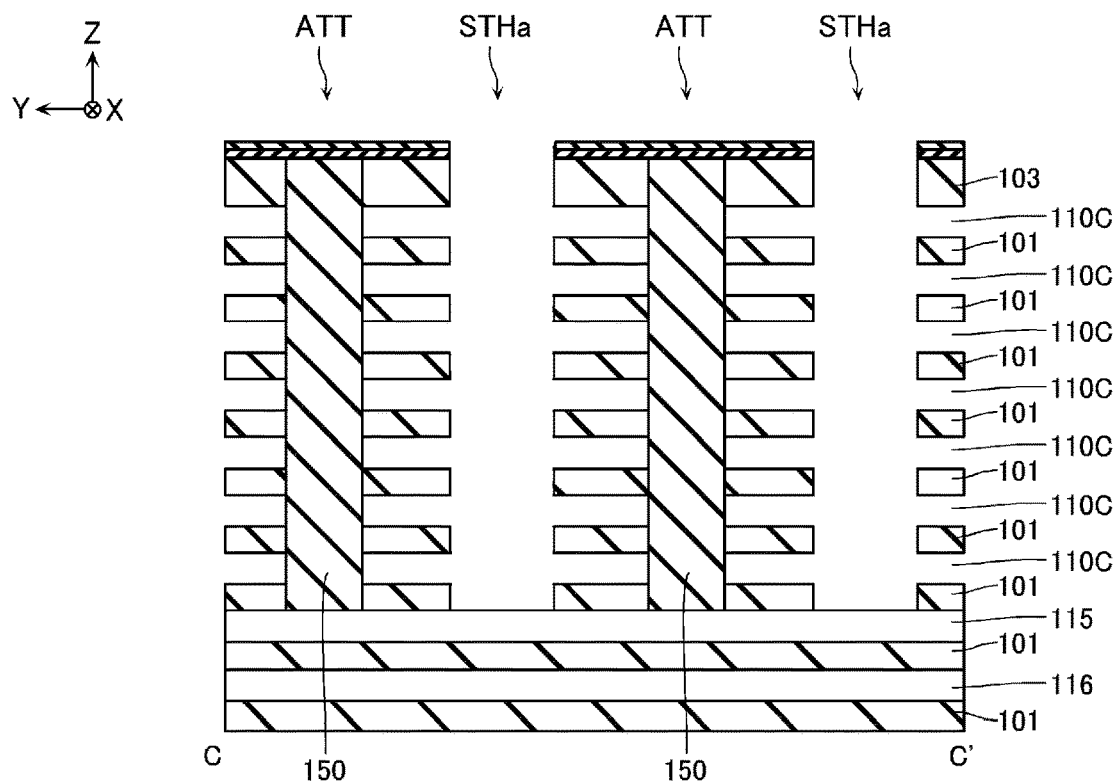
FIG. 44 is a schematic cross-sectional view illustrating the manufacturing method.
Figure 45:
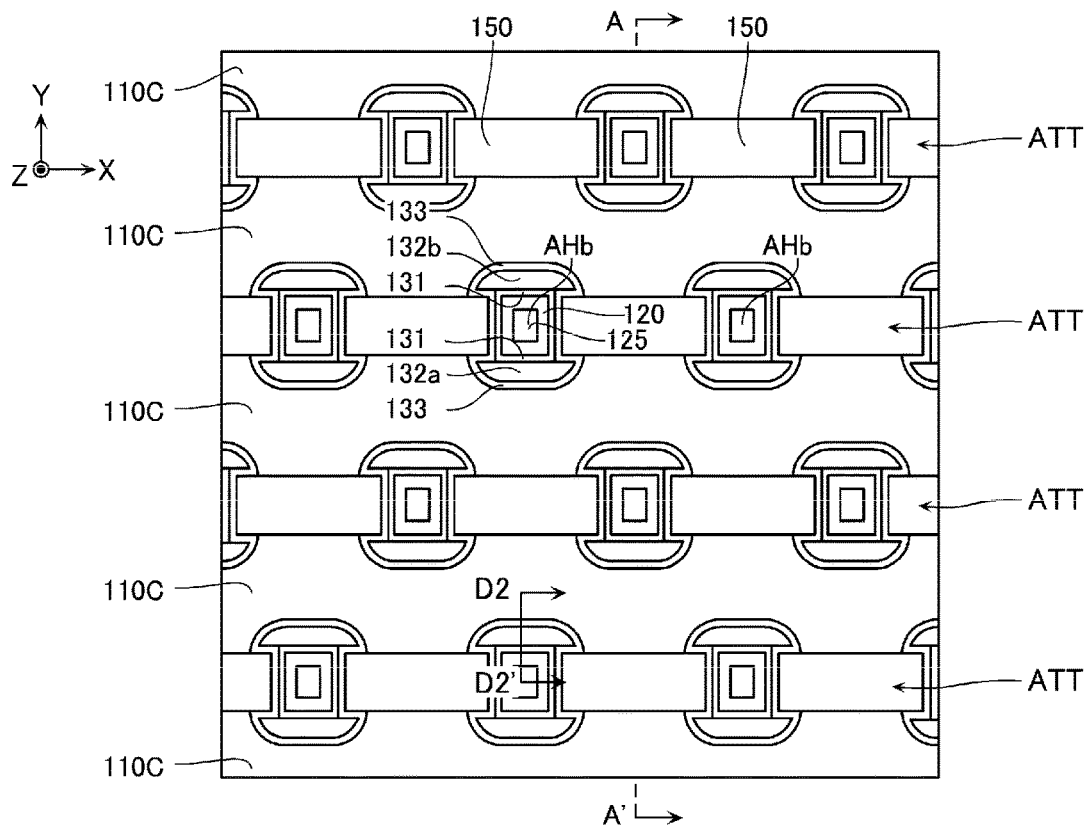
FIG. 45 is a schematic cross-sectional view illustrating the manufacturing method.
Figure 46:
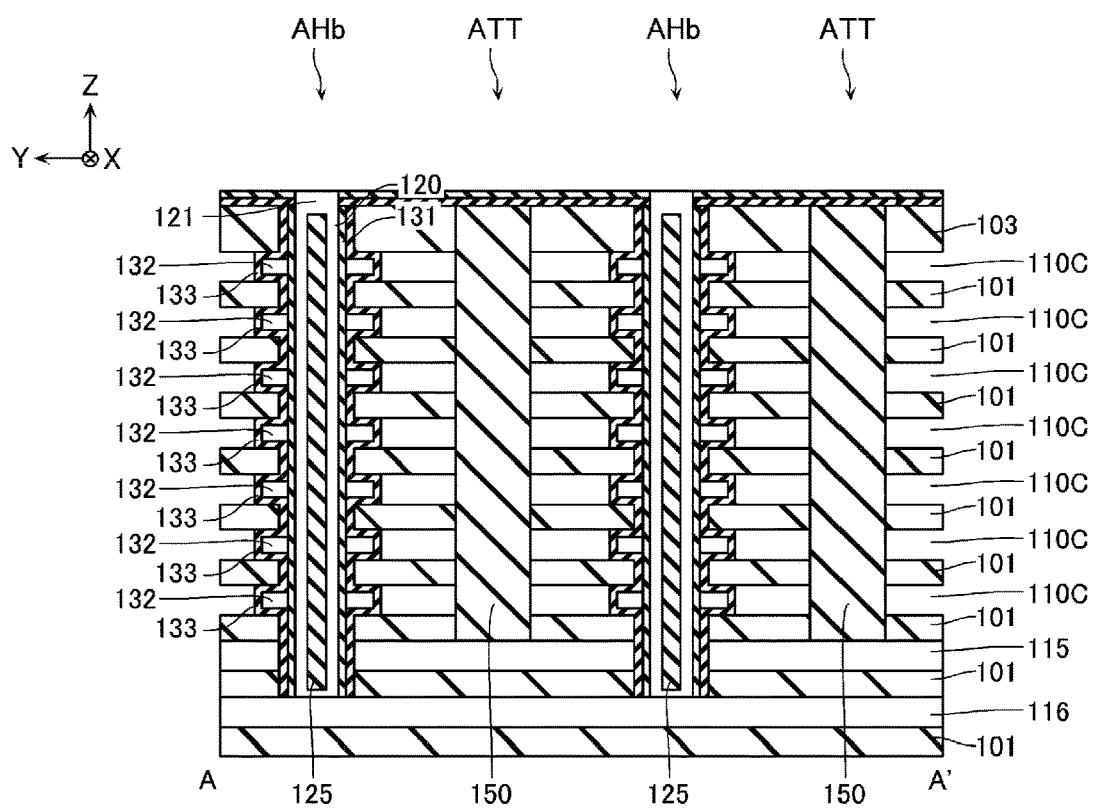
FIG. 46 is a schematic cross-sectional view illustrating the manufacturing method.
Figure 47:
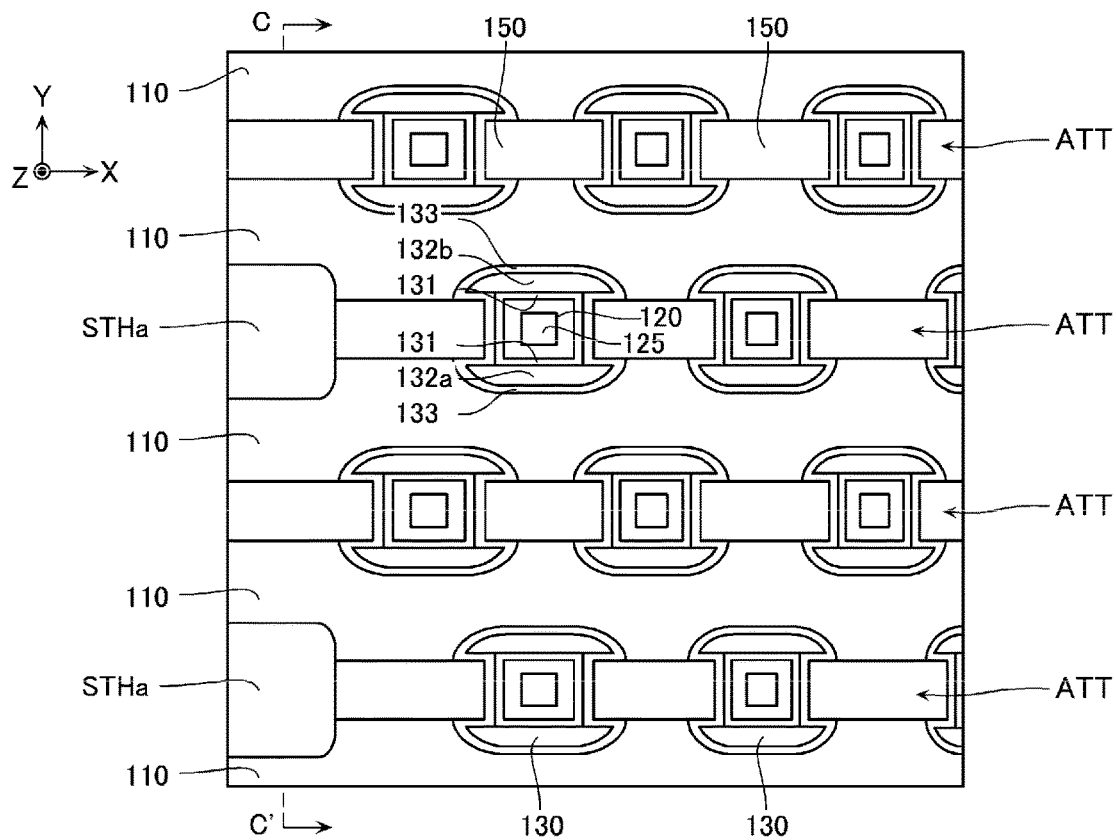
FIG. 47 is a schematic cross-sectional view illustrating the manufacturing method.
Figure 48:
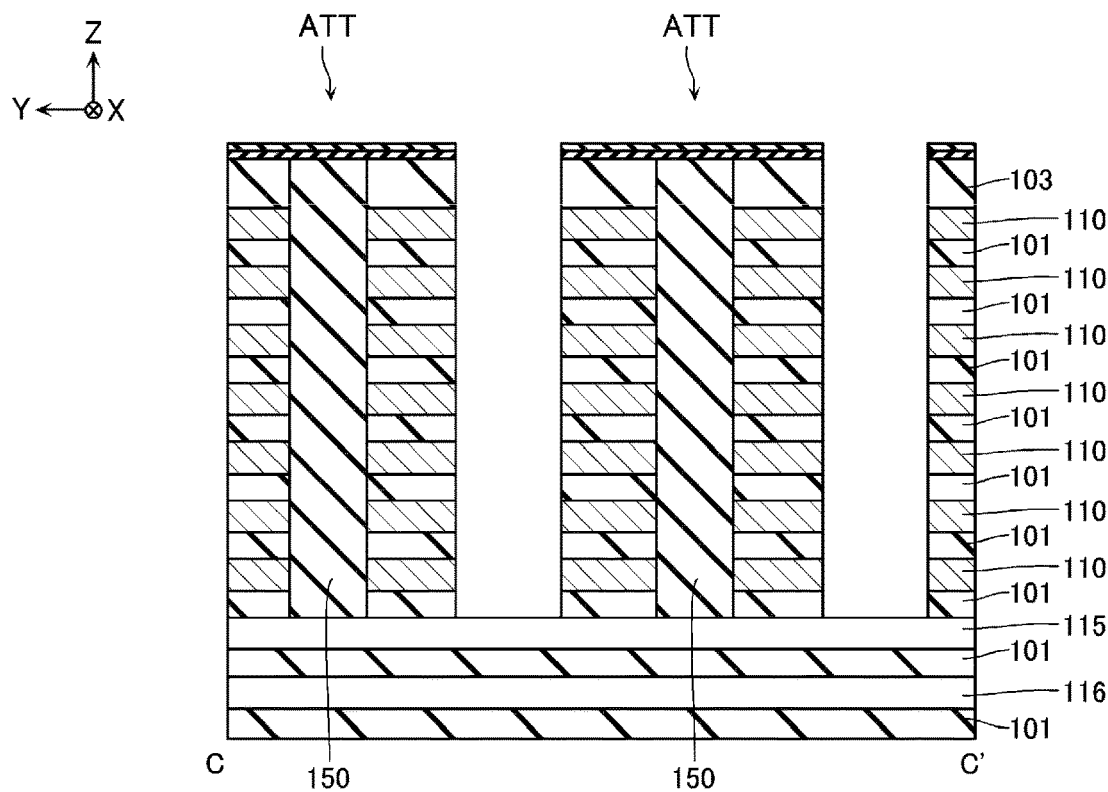
FIG. 48 is a schematic cross-sectional view illustrating the manufacturing method.
Figure 49:
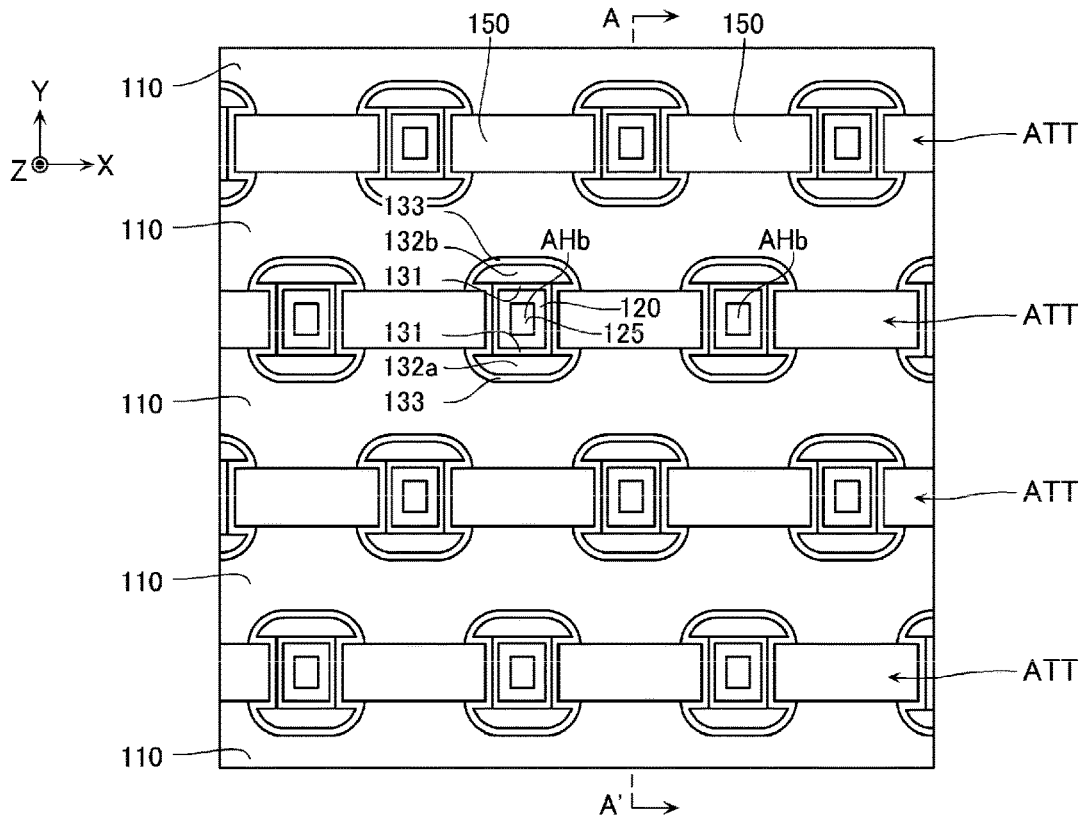
FIG. 49 is a schematic cross-sectional view illustrating the manufacturing method.
Figure 50:
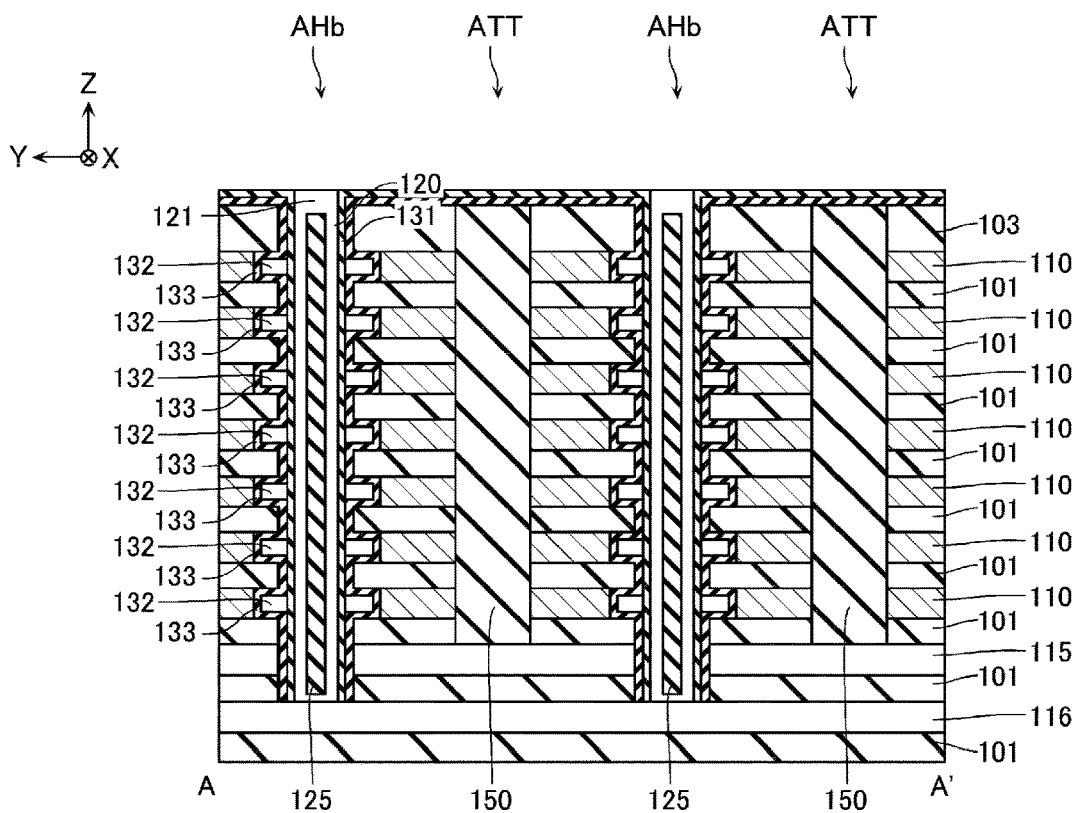
FIG. 50 is a schematic cross-sectional view illustrating the manufacturing method.

Next, as illustrated in FIGS. 41 and 42, an opening STHa is formed between each adjacent pair of the trenches ATT in the X direction. In this step, an insulating layer having openings corresponding to the openings STHa is formed on an upper surface of the structure illustrated in FIG. 40, and RIE, for example, is performed using the insulating layer as a mask. As illustrated in FIGS. 41 and 42, the openings STHa extend in the Z direction through the insulating layer 103, the plural insulating layers 101, and the plural sacrifice layers 110A so as to divide these components in the Y direction.

Next, as illustrated in FIGS. 43 to 46, via the openings STHa, the plural sacrifice layers 110A are removed to form plural hollows 110c. A step of removing the sacrifice layers 110A is performed by wet etching, for example. It is noted that this wet etching progresses from regions close to the openings STHa to regions far from the openings STHa, as described later.

Next, as illustrated in FIGS. 47 to 50, via the openings STHa, the plural conductive layers 110 are formed. As illustrated in FIG. 9, each of the conductive layers 110 is formed by forming the metal oxide layer 113, the barrier conductive layer 111, and the metal film 112 on the upper surface and the lower surface of the insulating layer 101. This step is performed by CVD, for example.

Thereafter, silicon oxide ($SiO_2$), for example, is deposited in the openings STHa to form the insulating layers STH, and components such as the bit line contacts BLC and the bit lines BL are formed to manufacture the semiconductor storage device according to the first embodiment.

Wet Etching of Sacrifice Layers 110A

The step of wet etching of the sacrifice layers 110A described with reference to FIGS. 43 to 46 will now be described in more detail.

Description will be made on an example where the sacrifice layers 110A to be etched are made of silicon nitride (SiN), for example, and layers not to be etched, such as the block insulating layers 133 and the insulating layers 150, are made of silicon oxide ($SiO_2$), for example. In this kind of wet etching step, such an appropriate liquid chemical is selected that an etching rate is high with respect to silicon nitride (SiN) to be etched, and that an etching rate is low with respect to silicon oxide ($SiO_2$) not to be etched. It is noted that for the liquid chemical for etching, phosphoric acid ($H_3PO_4$), for example, may be used, and other liquid chemicals may be selected as suited.

Figure 51:
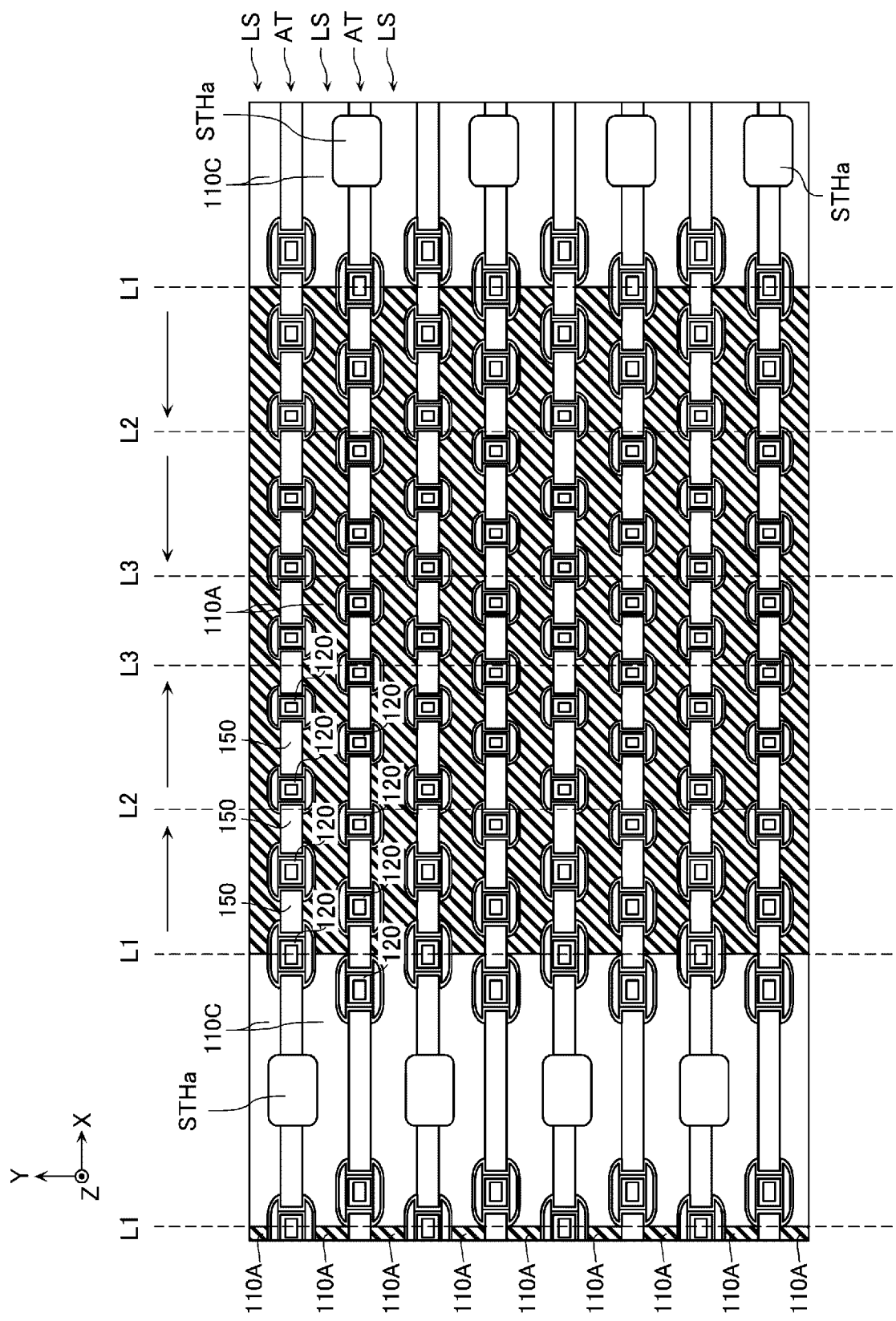
FIG. 51 is a schematic cross-sectional view illustrating a transition of etching progress with respect to sacrifice layers.
Figure 52:
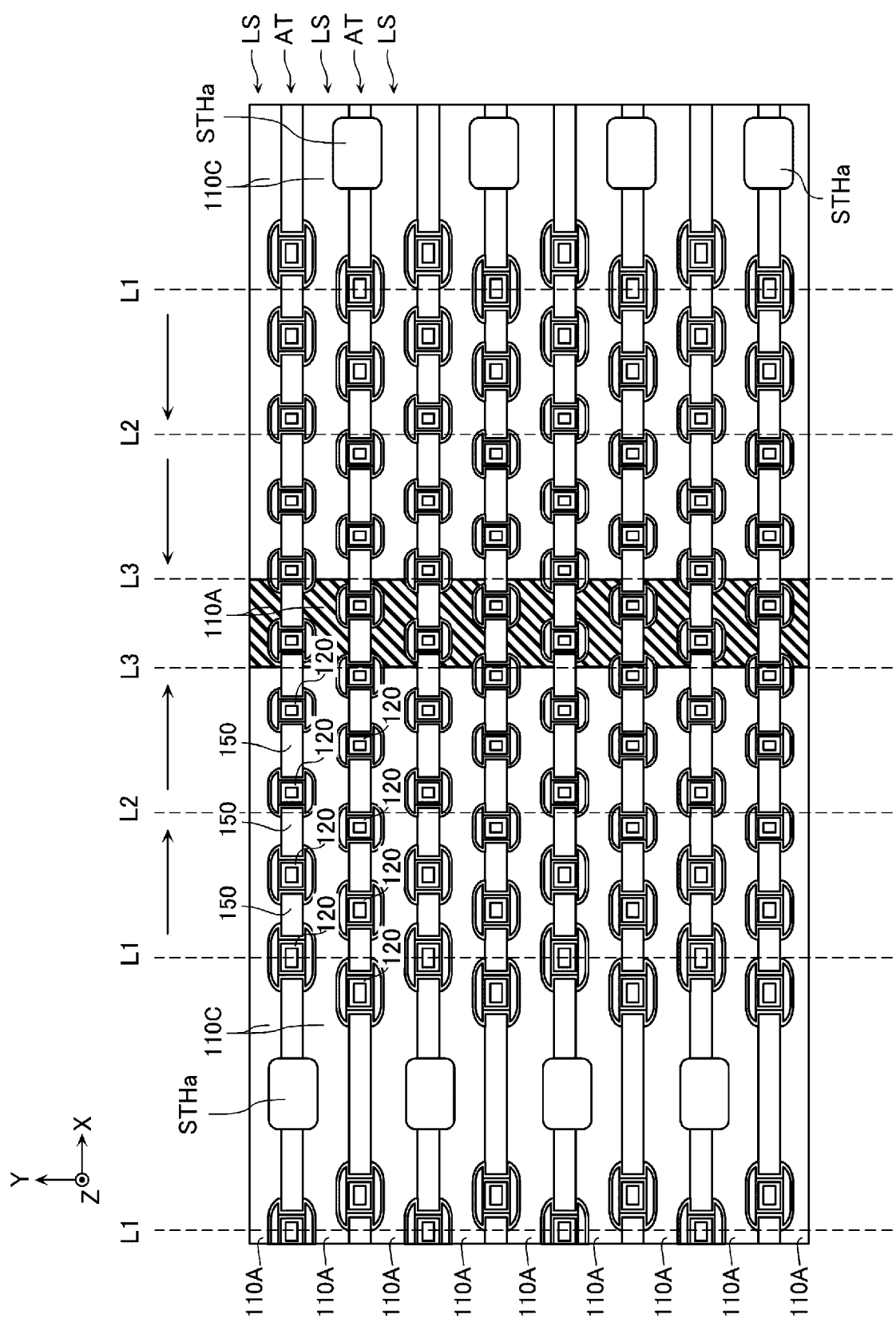
FIG. 52 is a schematic cross-sectional view illustrating a transition of the etching progress with respect to the sacrifice layers.

FIGS. 51 and 52 are schematic cross-sectional views illustrating a transition of etching progress with respect to the sacrifice layers 110A. FIG. 51 illustrates a state where etching progresses to an imaginary line L1 when a predetermined period of time elapses after a start of the etching of the sacrifice layers 110A. FIG. 52 illustrates a state where etching progresses to an imaginary line L3 when a predetermined period of time further elapses after the etching progresses to the imaginary line L1. In this manner, the etching starts in the vicinity of the openings STHa, and as time elapses from the start to an end of the etching, the etching progresses from regions close to the openings STHa to regions far from the openings STHa.

In such an etching process, the etching progresses relatively quickly to the vicinity of the memory cells MC close to the openings STHa. Consequently, the block insulating layers 133 of the memory cells MC close to the openings STHa are exposed to the liquid chemical for a long time. Meanwhile, the etching progresses relatively slowly to the vicinity of the memory cells MC far from the openings STHa. Consequently, the block insulating layers 133 of the memory cells MC far from the openings STHa are exposed to the liquid chemical only for a relatively short time.

Figure 53:
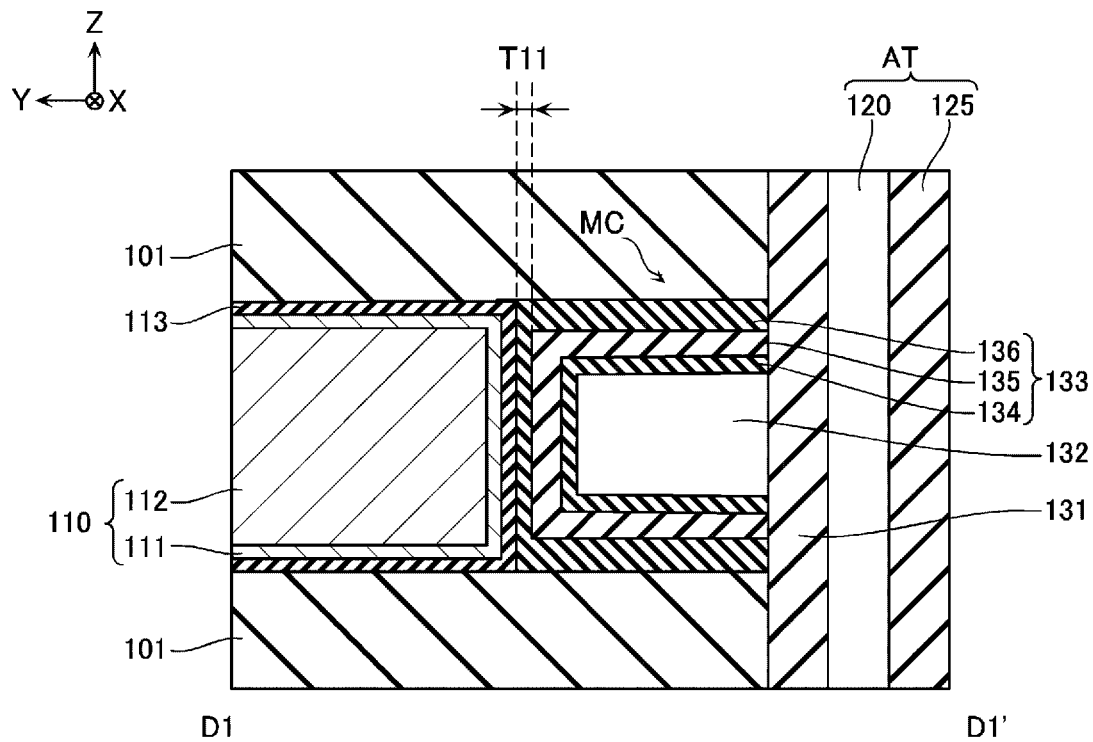
FIG. 53 is a schematic cross-sectional view of a memory cell relatively close to an insulating layer.
Figure 54:
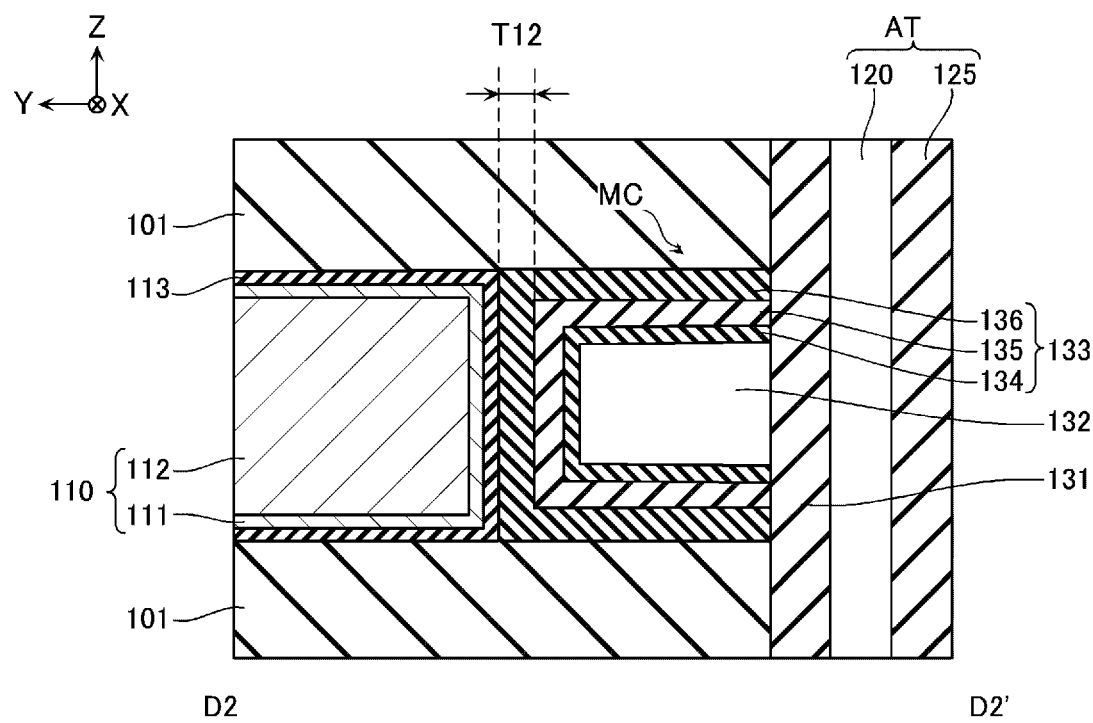
FIG. 54 is a schematic cross-sectional view of a memory cell relatively far from the insulating layer.

Shapes of the memory cells MC after the above-described step will be described with reference to FIGS. 53 and 54. FIG. 53 illustrates a Y-Z cross section of the memory cell MC relatively close to the insulating layer STH. FIG. 54 illustrates a Y-Z cross section of the memory cell MC relatively far from the insulating layer STH.

In the memory cell MC relatively close to the insulating layer STH (see FIG. 53), the block insulating layer 133 is exposed to the liquid chemical for a relatively long time, and consequently, a film thickness T11 of the insulating layer 136 in the X direction and the Y direction is small. Meanwhile, in the memory cell MC relatively far from the insulating layer STH (see FIG. 54), the block insulating layer 133 is exposed to the liquid chemical only for a relatively short time, and consequently, a film thickness T12 of the insulating layer 136 in the X direction and the Y direction remains larger than the film thickness T11. As a result, the closer the memory cell MC is to the opening STHa, the smaller the thickness of the insulating layer 136 in the X direction and the Y direction is.

Effects of the First Embodiment

In accordance with an increased integration of the semiconductor storage device, density of the arrangement of the memory cells MC in the X direction and the Y direction is being enhanced. As the density is enhanced, more memory cells MC are disposed on an X-Y plane. For this purpose, desirably, there are provided less ladder regions $R_{LD}$ including the openings STHa to remove the sacrifice layers 110A described with reference to FIG. 3 and other drawings. However, when the number of the ladder regions $R_{LD}$ is decreased, the distances between pairs of the openings STHa adjacent in the X direction are relatively long in some cases in the step described with reference to FIGS. 43 to 46.

When the distances between the insulating layers STH adjacent in the X direction are long, there is a large difference between the film thickness T11 and the film thickness T12 of the insulating layers 136 in the memory cell MC close to the insulating layer STH and the memory cell MC far from the insulating layer STH in some cases as described with reference to FIGS. 53 and 54.

Here, an influence of such a film thickness difference on write operation properties will be described. At the time of write operation, a predetermined write voltage is applied between the conductive layers 110 and the semiconductor layers 120, and a charge in the semiconductor layers 120 is stored in the charge storage layers 132 so as to adjust a threshold voltage of the memory cells MC. In the memory cell MC with the thin insulating layer 136 (see FIG. 53), a relatively intense electric field is applied to the charge storage layer 132 so that a charge is relatively more likely to be stored. Meanwhile, in the memory cell MC with the thick insulating layer 136 (see FIG. 54), only a relatively weak electric field is applied to the charge storage layer 132 so that a charge is relatively less likely to be stored. In this manner, in some cases, distance dependency with respect to the insulating layers STH occurs, that is, the charge is less likely to be stored as the distance from the insulating layers STH increases. In such cases, threshold voltages of the plural memory cells MC after write operation have a large deviation.

In view of this, according to the first embodiment, as described with reference to FIG. 10, in the memory cells MC farther from the insulating layers STH, the semiconductor layers 120 in the X direction have smaller widths. The reason is that a phenomenon described later makes a charge more likely to be stored in the charge storage layers 132 as the widths of the semiconductor layers 120 in the X direction are smaller.

Next, description will be made on the phenomenon that the charge is more likely to be stored as the widths of the semiconductor layers 120 in the X direction are smaller. In an X-Y cross section (see FIG. 8), although the charge storage layer 132 and the conductive layer 110 are next to each other in the Y direction, the charge storage layer 132 and the conductive layer 110 include portions next to each other in the X direction on opposite ends of the charge storage layer 132 in the X direction. In such a shape, as the width of the semiconductor layer 120 in the X direction is smaller, a ratio of the portions opposed in the X direction on opposite ends increases. Thus, a ratio of an area where the charge storage layer 132 and the conductive layer 110 are next to each other to an area where the charge storage layer 132 and the semiconductor layer 120 are next to each other increases as the width of the semiconductor layer 120 in the X direction is smaller.

Next, consideration will be given to a ratio of a capacitance between the charge storage layer 132 and the conductive layer 110 to a capacitance between the charge storage layer 132 and the semiconductor layer 120 in this case. As the width of the semiconductor layer 120 in the X direction is smaller, the ratio of the area where the charge storage layer 132 is next to the conductive layer 110 increases so that the above-described ratio of the capacitance accordingly increases. In this manner, as the capacitance ratio on the conductive layer 110 side where the voltage is applied is higher, the charge is more likely to be stored in the charge storage layer 132.

Therefore, the widths of the semiconductor layers 120 in the X direction are decreased in the memory cells MC farther from the insulating layers STH so as to cancel a consequence when the thickness of the block insulating layers 133 increases in the memory cells MC farther from the insulating layers STH and makes the charge less likely to be stored. Thus, properties of the memory cells MC in the X-Y cross section can be made uniform to reduce an operational irregularity, thereby providing the semiconductor storage device capable of highly accurate write operation.

Modification of the First Embodiment

Figure 55:
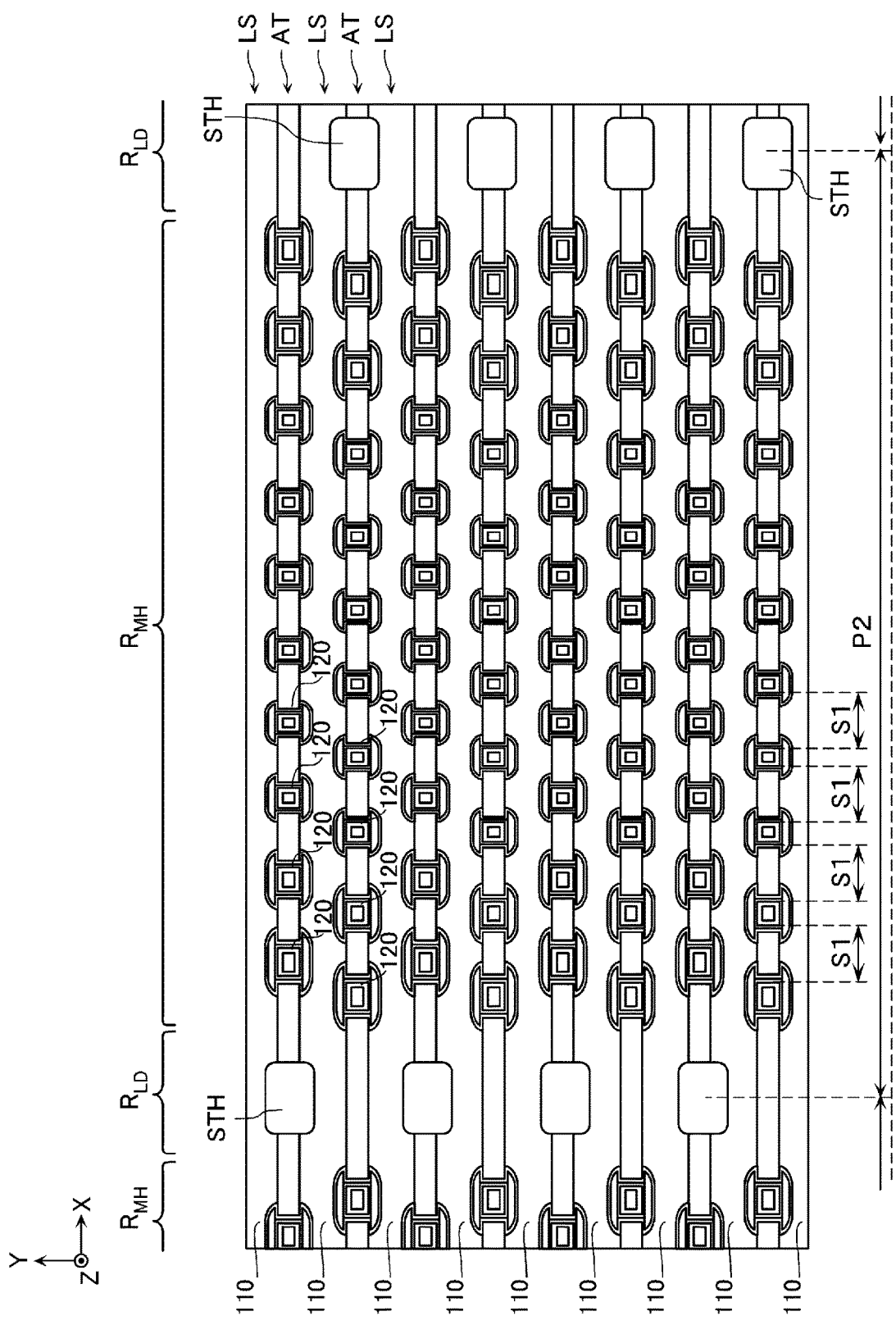
FIG. 55 is a schematic cross-sectional view of a semiconductor storage device according to a modification.

FIG. 55 is a schematic cross-sectional view of a semiconductor storage device according to a modification of the first embodiment. Basically, the semiconductor storage device according to this modification has substantially the same configuration as the first embodiment. However, the semiconductor storage device according to the modification is different from the first embodiment in that the plural semiconductor layers 120 are not disposed in the X direction with the pitch P1 but that the semiconductor layers 120 are disposed at an interval Si from the adjacent semiconductor layers 120. In this configuration, as the widths of the semiconductor layers 120 in the X direction are smaller, distances between centers of the plural semiconductor layers 120 are decreased. In this configuration, the bit lines BL extending in the Y direction may or may not be disposed at regular intervals in the X direction.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a first conductive layer extending in a first direction;
a second conductive layer extending in the first direction and disposed apart from the first conductive layer in a second direction intersecting the first direction;
a third conductive layer extending in the first direction and disposed apart from the first conductive layer and the second conductive layer in the second direction;
a plurality of first semiconductor layers interposed between the first conductive layer and the second conductive layer, each of the plurality of first semiconductor layers including regions adjacent the first conductive layer and the second conductive layer, respectively;
a plurality of first memory cells interposed between the first conductive layer and the plurality of first semiconductor layers;
a plurality of second memory cells interposed between the second conductive layer and the plurality of first semiconductor layers;
a plurality of second semiconductor layers interposed between the second conductive layer and the third conductive layer, each of the plurality of second semiconductor layers including regions adjacent the second conductive layer and the third conductive layer, respectively;
a plurality of third memory cells interposed between the second conductive layer and the plurality of second semiconductor layers;
a plurality of fourth memory cells interposed between the third conductive layer and the plurality of second semiconductor layers;
a first insulating layer interposed between the first conductive layer and the second conductive layer, the first insulating layer being wider than the plurality of first semiconductor layers and the plurality of second semiconductor layers in the second direction; and
a second insulating layer interposed between the second conductive layer and the third conductive layer, the second insulating layer being wider than the first semiconductor layers and the second semiconductor layers in the second direction,
wherein a third semiconductor layer and a fourth semiconductor layer from among the plurality of first semiconductor layers are provided as follows: the third semiconductor layer has a first width in the first direction; the third semiconductor layer and the first insulating layer are disposed apart from each other in the first direction with a first distance; the third semiconductor layer and the second insulating layer are disposed apart from each other in the first direction with a second distance; the fourth semiconductor layer has a second width in the first direction; the fourth semiconductor layer and the first insulating layer are disposed apart from each other in the first direction with a third distance; and the fourth semiconductor layer and the second insulating layer are disposed apart from each other in the first direction with a fourth distance,
wherein a shorter one of the first distance and the second distance is shorter than a shorter one of the third distance and the fourth distance, and the first width is larger than the second width.

2. The semiconductor storage device according to claim 1, wherein a fifth one and a sixth one of the plurality of second semiconductor layers are provided as follows: the fifth semiconductor layer has a third width in the first direction; the fifth semiconductor layer and the first insulating layer are disposed apart from each other in the first direction with a fifth distance; the fifth semiconductor layer and the second insulating layer has a sixth distance in the first direction; the sixth semiconductor layer has a fourth width in the first direction; the sixth semiconductor layer and the first insulating layer are disposed apart from each other in the first direction with a seventh distance; and the sixth semiconductor layer and the second insulating layer are disposed apart from each other in the first direction with an eighth distance, and wherein a shorter one of the fifth distance and the sixth distance is shorter than a shorter one of the seventh distance and the eighth distance, and the third width is larger than the fourth width.

3. The semiconductor storage device according to claim 1, comprising:

a plurality of the first conductive layers disposed in a third direction intersecting the first direction and the second direction;

a plurality of the second conductive layers disposed in the third direction; and a plurality of the third conductive layers disposed in the third direction.

4. The semiconductor storage device according to claim 3, wherein the first insulating layer and the second insulating layer extend in the third direction and are interposed between the plurality of first conductive layers and the plurality of second conductive layers, or between the plurality of third conductive layers and the plurality of second conductive layers.

5. The semiconductor storage device according to claim 1, further comprising:

a plurality of first charge storage layers interposed between the first conductive layer and the plurality of first semiconductor layers; and a plurality of second charge storage layers interposed between the second conductive layer and the plurality of first semiconductor layers.

6. The semiconductor storage device according to claim 1, wherein the plurality of first semiconductor layers and the plurality of second semiconductor layers each extend in a third direction intersecting the first direction and the second direction.

7. The semiconductor storage device according to claim 1, further comprising a third semiconductor layer with an N-type impurity disposed on an upper end of each of the first and second semiconductor layers.

8. The semiconductor storage device according to claim 1, further comprising a gate insulating layer between each of the plurality of first semiconductor layers and the first conductive layer, between each of the plurality of first semiconductor layers and the second conductive layer, between each of the plurality of second semiconductor layers and the second conductive layer, between each of the plurality of second semiconductor layers and the third conductive layer.

9. The semiconductor storage device according to claim 8, wherein the gate insulating layer includes a tunnel insulating layer, a charge storage layer, and a block insulating layer.

10. A semiconductor storage device comprising:

a plurality of first semiconductor layers disposed with respect to each other in a first direction, the plurality of first semiconductor layers each including regions disposed adjacent a first conductive layer and a second conductive layer, respectively;

a plurality of second semiconductor layers disposed with respect to each other in the first direction, each of the plurality of second semiconductor layers including a region disposed adjacent the second conductive layer and a third conductive layer, respectively, wherein the first to third conductive layers, each extending along the first direction, are disposed with respect to each other in a second direction perpendicular to the first direction;

a first insulating layer interposed between the first conductive layer and the second conductive layer, the first insulating layer being wider than the plurality of first semiconductor layers and the plurality of second semiconductor layers in the second direction;

a second insulating layer interposed between the second conductive layer and the third conductive layer, the second insulating layer being wider than the first semiconductor layer and the second semiconductor layer in the second direction, wherein a third one and a fourth one of the plurality of first semiconductor layers are provided as follows: the third semiconductor layer has a first width in the first direction; the third semiconductor layer and the first insulating layer are disposed apart from each other in the first direction with a first distance; the third semiconductor layer and the second insulating layer are disposed apart from each other in the first direction with a second distance; the fourth semiconductor layer has a second width in the first direction; the fourth semiconductor layer and the first insulating layer are separated apart from each other in the first direction with a third distance; and the fourth semiconductor layer and the second insulating layer are separated apart from each other in the first direction with a fourth distance, and wherein a shorter one of the first distance and the second distance is shorter than a shorter one of the third distance and the fourth distance, and the first width is larger than the second width.

11. The semiconductor storage device according to claim 10, wherein a plurality of first memory cells are interposed between the first conductive layer and the plurality of first semiconductor layers, and a plurality of second memory cells interposed between the second conductive layer and the plurality of first semiconductor layers.

12. The semiconductor storage device according to claim 10, wherein a plurality of third memory cells are interposed between the second conductive layer and the plurality of second semiconductor layers, and a plurality of fourth memory cells interposed between the third conductive layer and the plurality of second semiconductor layers.

13. The semiconductor storage device according to claim 10, wherein the first insulating layer and the second insulating layer each extend in a third direction perpendicular to the first and second directions.

14. The semiconductor storage device according to claim 10, wherein the plurality of first semiconductor layers and the plurality of second semiconductor layers each extend in a third direction perpendicular to the first and second directions.

* * * * *